(12) United States Patent
Kase et al.

(10) Patent No.: US 11,997,870 B2
(45) Date of Patent: *May 28, 2024

(54) ORGANIC ELECTROLUMINESCENT ELEMENT AND METHOD FOR PRODUCING SAME

(71) Applicant: HODOGAYA CHEMICAL CO., LTD., Tokyo (JP)

(72) Inventors: Kouki Kase, Tokyo (JP); Takeshi Yamamoto, Tokyo (JP); Kazuyuki Suruga, Tokyo (JP); Shunji Mochizuki, Tokyo (JP); Shuichi Hayashi, Tokyo (JP)

(73) Assignee: HODOGAYA CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/325,613

(22) Filed: May 30, 2023

(65) Prior Publication Data

US 2023/0309339 A1    Sep. 28, 2023

Related U.S. Application Data

(62) Division of application No. 16/954,913, filed as application No. PCT/JP2018/047294 on Dec. 21, 2018, now Pat. No. 11,706,943.

(30) Foreign Application Priority Data

Dec. 21, 2017    (JP) ................... 2017-244969

(51) Int. Cl.
*H10K 50/844* (2023.01)
(52) U.S. Cl.
CPC ................. *H10K 50/844* (2023.02)

(58) Field of Classification Search
None
See application file for complete search history.

(56) References Cited

U.S. PATENT DOCUMENTS

| | | | |
|---|---|---|---|
| 11,706,943 B2 * | 7/2023 | Kase | H10K 50/844 428/411.1 |
| 2008/0023724 A1 | 1/2008 | Takeda et al. | |

(Continued)

FOREIGN PATENT DOCUMENTS

| | | |
|---|---|---|
| CN | 1935935 A | 3/2007 |
| CN | 102057514 A | 5/2011 |

(Continued)

OTHER PUBLICATIONS

Google Patents translation of WO 2015/001726 A1 (Year: 2015).*

(Continued)

*Primary Examiner* — Ramsey Zacharia
(74) *Attorney, Agent, or Firm* — Birch, Stewart, Kolasch & Birch, LLP

(57)    ABSTRACT

The present disclosure is related to an organic EL element including a capping layer that contains a compound represented by formula (A-1). In the formula, A and X are monovalent groups represented by formula (B-1) having 1 binding site among $R_1$ to $R_6$. Z represents a monovalent group represented by formula (B-1) having 1 binding site among $R_1$ to $R_6$, an aromatic hydrocarbon group, an aromatic heterocyclic group or a fused polycyclic aromatic group. Ar is a single bond or a divalent group of an aromatic hydrocarbon group, an aromatic heterocyclic group, or a fused polycyclic aromatic group. $R_1$ to $R_6$ are each defined in the specification, and Q represents a nitrogen atom, an oxygen atom, or a sulfur atom.

(Continued)

[Chemical Formula 1]

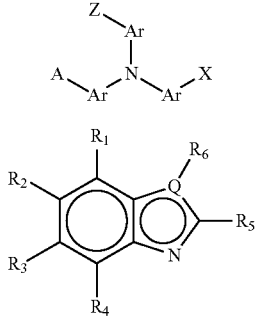

(A-1)

(B-1)

11 Claims, 1 Drawing Sheet

(56) References Cited

U.S. PATENT DOCUMENTS

| | | |
|---|---|---|
| 2012/0138918 A1 | 6/2012 | Naraoka et al. |
| 2012/0161107 A1 | 6/2012 | Yokoyama et al. |
| 2014/0225100 A1 | 8/2014 | Yokoyama et al. |

FOREIGN PATENT DOCUMENTS

| | | |
|---|---|---|
| EP | 3 432 688 A1 | 1/2019 |
| JP | 8-48856 A | 2/1996 |
| JP | 3194657 B2 | 7/2001 |
| JP | 2002-329577 A | 11/2002 |
| KR | 10-0861168 B1 | 9/2008 |
| KR | 10-2017-0116927 A | 10/2017 |
| KR | 10-2059550 B1 | 12/2019 |
| WO | WO2006/109493 A1 | 10/2006 |
| WO | WO2011/043083 A1 | 4/2011 |
| WO | WO2013/038627 A1 | 3/2013 |
| WO | WO2014/009310 A1 | 1/2014 |
| WO | WO2015/001726 A1 | 1/2015 |
| WO | WO-2015001726 A1 * | 1/2015 ......... H01L 51/0059 |
| WO | WO2017/183625 A1 | 10/2017 |

OTHER PUBLICATIONS

Chinese Office Action and Search Report for Chinese Application No. 201880082158.4, dated Jan. 11, 2023, with an English translation of the Chinese Office Action.
Endo et al., "Efficient up-conversion of triplet excitons into a singlet state and its application for organic light emitting diodes", Applied Physics Letters, 2011, vol. 98, p. 083302, total 3 pages.
Evindar et al., "Parallel Synthesis of a Library of Benzoxazoles and Benzothiazoles Using Ligand-Accelerated Copper-Catalyzed Cyclizations of ortho-Halobenzanilides", J. Org. Chem., 2006, vol. 71, No. 5, pp. 1802-1808.
Extended European Search Report for European Application No. 18890439.5, dated Sep. 3, 2021.
Hosokawa et al., "Development of Styryl-Based Light Emitting Material", Proceedings of the 9th Japan Society of Applied Physics Meeting, 2001, pp. 55-61, total 8 pages.
Hung et al., "Application of an ultrathin LIF/Al bilayer in organic surface-emitting diodes", Applied Physics Letters, Jan. 22, 2001, vol. 78, No. 4, pp. 544-546.
International Search Report for PCT/JP2018/047294 mailed on Mar. 19, 2019.
Ishiyama et al., "Palladium(0)-Catalyzed Cross-Coupling Reaction of Alkoxydiboron with Haloarenes: A Direct Procedure for Arylboronic Esters", J. Org. Chem., 1995, vol. 60, No. 23, pp. 7508-7510.
Kannan et al., "Toward Highly Active Two-Photon Absorbing Liquids. Synthesis and Characterization of 1,3,5-Triazine-Based Octupolar Molecules", Chemistry of Materials, vol. 16, No. 1, Nov. 22, 2003, pp. 185-194.
Machine translation of KR 10-2017-0116927 A (Year:2017).
Miyaura et al., "The Palladium-Catalyzed Cross-Coupling Reaction of Phenylboronic Acid With Haloarenes in the Presence of Bases", Synthetic Communications, 1981, vol. 11, No. 7, pp. 513-519.
Riel et al., "Phosphorescent top-emitting organic light-emitting devices with improved light outcoupling", Applied Physics Letters, Jan. 20, 2003, vol. 82, No. 3, pp. 466-468.
U.S. Notice of Allowance for U.S. Appl. No. 16/954,913, dated Mar. 21, 2023.
U.S. Office Action for U.S. Appl. No. 16/954,913, dated Dec. 1, 2022.
U.S. Office Action for U.S. Appl. No. 16/954,913, dated Sep. 20, 2022.

* cited by examiner

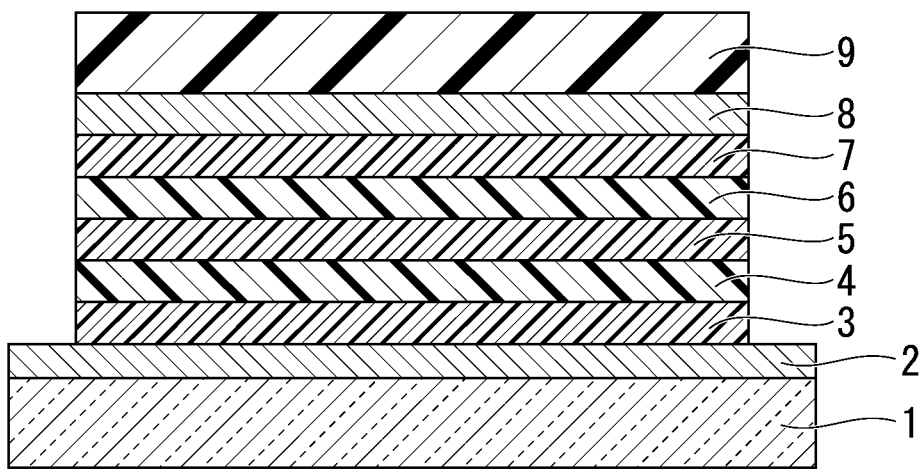

ORGANIC ELECTROLUMINESCENT ELEMENT AND METHOD FOR PRODUCING SAME

CROSS-REFERENCE TO RELATED APPLICATIONS

This application is a Divisional application of co-pending application Ser. No. 16/954,913, filed on Jun. 17, 2020, which is the National Phase under 35 U.S.C. § 371 of International Application No. PCT/JP2018/047294, filed on Dec. 21, 2018, which claims the benefit under 35 U.S.C. § 119(a) to Patent Application No. 2017-244969, filed in Japan on Dec. 21, 2017, all of which are hereby expressly incorporated by reference into the present application.

TECHNICAL FIELD

The present disclosure relates to an organic electroluminescent element (hereinafter, "organic electroluminescent element" in some cases is abbreviated as "organic EL element".) and a method of producing the same.

Priority is claimed on Japanese Patent Application No. 2017-244969, filed in Japan on Dec. 21, 2017, the content of which is incorporated herein by reference.

BACKGROUND ART

Since an organic EL element is a self-luminous element, the organic EL element has brighter, superior visibility and ability to display clearer images in comparison with a liquid crystal element. For this reason, the organic EL element has been actively studied.

In 1987, C. W. Tang and colleagues at Eastman Kodak developed a laminated structure element using materials assigned different roles. This realized practical applications of an organic EL element with organic materials. These researchers laminated an electron-transporting phosphor and a hole-transporting organic material, and injected both charges into a phosphor layer to cause emission. As a result, a high luminance of 1,000 cd/m$^2$ or more at a voltage of 10 V or less (refer to Patent Documents 1 and 2, for example) was obtained.

To date, various improvements have been made for practical applications of the organic EL element. Various roles of the laminated structure are further subdivided to provide an electroluminescence element that includes an anode, a hole injection layer, a hole transport layer, a luminous layer, an electron transport layer, an electron injection layer, and a cathode successively formed on a substrate, wherein high efficiency and durability are achieved by a light emitting element of bottom emission structure that emits light from the bottom (refer to Non-Patent Document 1, for example).

In recent years, a light emitting element of top emission structure that emits light from the top using metal with a high work function as an anode has been used. The light emitting element of bottom emission structure is restricted in terms of light emitting area by a pixel circuit. On the other hand, the light emitting element of top emission structure has an advantage of having a wide light emitting area. In the light emitting element of top emission structure, a semitransparent electrode of LiF/Al/Ag (refer to Non-patent document 2, for example), Ca/Mg (refer to Non-patent document 3, for example), LiF/MgAg, or the like is used as a cathode.

In such a light emitting element, when light emitted in a luminous layer enters another film at a given or greater angle, the light is totally reflected at an interface between the luminous layer and the other film. Consequently, only a part of the emitted light was utilized. In recent years, a light emitting element provided with a "capping layer" with a high refractive index, on the outside of a semitransparent electrode with a low refractive index has been proposed to improve light extraction efficiency (refer to Non-patent documents 2 and 3, for example).

Regarding effect of the capping layer in the light emitting element of the top emission structure, an efficiency improvement of about 1.7 times is recognized in the light emitting element using tris(2-phenylpyridine) iridium (III) (Ir(ppy)$_3$) as a luminous material. In the case where there was no capping layer, the current efficiency was 38 cd/A, whereas in the case of the light emitting element using ZnSe having a film thickness of 60 nm as the capping layer, the current efficiency was 64 cd/A. It is also indicated that the highest point of transmittance of the semitransparent electrode and the capping layer does not necessarily coincide with the highest point of efficiency. It is indicated that the maximum point of light extraction efficiency is determined by an interference effect (refer to Non-patent document 3, for example).

Conventionally, it has been proposed to use a metal mask having high definition for forming a capping layer. However, when the metal mask is used under a high temperature condition, there is a problem in that alignment accuracy decreases because the metal mask is distorted by heat. Therefore, ZnSe cannot be deposited at an accurate position by using a metal mask with high definition, which may affect the light emitting element itself, because ZnSe has a high melting point of 1100° C. or higher (for example, see Non-Patent Document 3.), Furthermore, deposition by sputtering also affects the light emitting element. For this reason, a capping layer made of an inorganic material is not suitable for use.

In addition, tris(8-hydroxyquinoline)aluminum (hereinafter, referred to as "Alq$_3$") may be used as a capping layer for adjusting the refractive index (for example, see Non-Patent Document 2.). Alq$_3$ is known as an organic EL material commonly used as a green luminous material or an electron transport material. However, Alq$_3$ has a weak absorption near 450 nm, which is used in blue luminous materials. For this reason, there has been a problem of causing a decrease in color purity and a decrease in light extraction efficiency in the case of the blue light emitting element.

Further, in a conventional element provided with a capping layer, there is a problem in that light having a wavelength of 400 nm to 410 nm of sunlight passes through the element, thereby affecting the material inside the element, and thus decreasing the color purity and the light extraction efficiency.

In order to improve the element characteristics of an organic EL element, it is particularly required to absorb light having a wavelength of 400 nm to 410 nm of sunlight so as not to affect the material inside the element. Further, in order to significantly improve the light extraction efficiency, a material having a high absorption coefficient, a high refractive index, and excellent stability and durability of a thin film is required as a material for the capping layer.

[Patent Document 1] Publication of Unexamined Patent Application No. H08-048656
[Patent Document 2] Japanese Patent No. 3194657
[Patent Document 3] WO 2014/009310
[Patent Document 4] WO 2013/038627

[Non-Patent Document 1] Proceedings of the 9th Session of the Japan Society of Applied Physics, pages 55 to 61 (2001)

[Non-Patent Document 2] Appl. Phys. Lett., 78, 544 (2001)

[Non-Patent Document 3] Appl. Phys. Lett., 82, 466 (2003)

[Non-Patent Document 4] J. Org. Chem., 71, 1802 (2006)

[Non-Patent Document 5] J. Org. Chem., 60, 7508 (1995))

[Non-Patent Document 6] Synth. Commun., 11, 513 (1981)

[Non-Patent Document 7] Appl. Phys. Lett., 98, 083302 (2011)

SUMMARY OF THE INVENTION

It is an object of the present disclosure to provide a long-life organic EL element having high luminance, excellent light emission efficiency and power efficiency, and a method producing the same.

In order to achieve the above object, the inventors of the present invention carried out intensive studies as follows.

That is, by focusing on the fact that the arylamine-based material has excellent stability and durability of the thin film, from amine compounds having a specific benzazole ring structure with a high refractive index, a material having a high absorbance at a wavelength of 400 nm to 410 nm in an absorption spectrum at a concentration of $10^{-5}$ mol/L was selected. Then, an organic EL element using this material as a material for the capping layer was manufactured, and a rigorous evaluation of the element's characteristics was performed. As a result, the present invention was completed.

That is, according to the present disclosure, the following organic EL elements are provided.

[1] An organic electroluminescent element comprising at least an anode, a hole transport layer, a luminous layer, an electron transport layer, a cathode and a capping layer in this order, wherein the capping layer comprises an amine compound having a benzazole ring structure represented by a general formula (A-1),

[Chemical Formula 1]

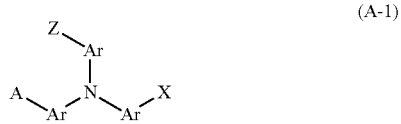

(A-1)

wherein in formula (A-1), A and X may be the same or different from each other, and each represents a monovalent group represented by general formula (B-1) having one bonding site among $R_1$ to $R_6$; Z represents a monovalent group represented by general formula (B-1) having one bonding site among $R_1$ to $R_6$, a substituted or unsubstituted aromatic hydrocarbon group; a substituted or unsubstituted aromatic heterocyclic group, or a substituted or unsubstituted fused polycyclic aromatic group; and Ar may be the same or different from each other, and each represents a single bond or a divalent group of a substituted or unsubstituted aromatic hydrocarbon group, a substituted or unsubstituted aromatic heterocyclic group, or a substituted or unsubstituted fused polycyclic aromatic group,

[Chemical Formula 2]

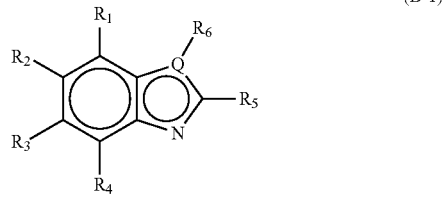

(B-1)

wherein in formula (B-1), $R_1$ to $R_6$ may be the same or different from each other, and each represents a linking group as a binding site, a hydrogen atom, a deuterium atom, a fluorine atom, a chlorine atom, a cyano group, a nitro group, a linear or branched alkyl group having 1 to 6 carbon atoms which may have a substituent, a cycloalkyl group having 5 to 10 carbon atoms which may have a substituent, a linear or branched alkenyl group having 2 to 6 carbon atoms which may have a substituent, a linear or branched alkyloxy group having 1 to 6 carbon atoms which may have a substituent, a cycloalkyloxy group having 5 to 10 carbon atoms which may have a substituent, a substituted or unsubstituted aromatic heterocyclic group, a substituted or unsubstituted aromatic hydrocarbon group, a substituted or unsubstituted fused polycyclic aromatic group or a substituted or unsubstituted aryloxy group; and Q represents a nitrogen atom, an oxygen atom or a sulfur atom, and when Q represents an oxygen atom or a sulfur atom, Q does not have $R_6$.

[2] The organic electroluminescent element according to [1], wherein the capping layer comprises a material having an extinction coefficient of 0.2 or more in a wavelength range from 400 nm to 410 nm and an absorbance of 0.2 or more in an absorption spectrum at a concentration of $10^{-5}$ mol/L in a wavelength range from 400 nm to 410 nm.

[3] The organic electroluminescent element according to [1], wherein the general formula (B-1) is represented by the following general formula (B-2) or (B-3),

[Chemical Formula 3]

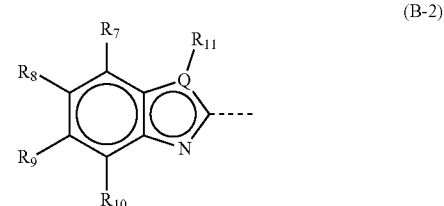

(B-2)

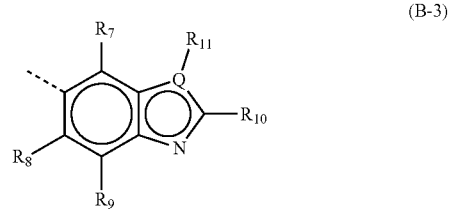

(B-3)

wherein in formulae (B-2) and (B-3), a broken line portion is used as a binding site; $R_7$ to $R_{11}$ may be the same or different from each other, and each represents a hydrogen atom, a deuterium atom, a fluorine atom, a chlorine atom, a cyano group, a nitro group, a straight or branched alkyl group having 1 to 6 carbon atoms which may have a substituent, a cycloalkyl group having 5 to 10 carbon atoms which may have a substituent, a straight or branched alkenyl group having 2 to 6 carbon atoms which may have a substituent, a straight or branched alkyloxy group having 1 to 6 carbon atoms which may have a substituent, a cycloalkyloxy group having 5 to 10 carbon atoms which may have a substituent, a substituted or unsubstituted aromatic hydrocarbon group, a substituted or unsubstituted aromatic ring group, a heterocyclic ring group, a substituted or unsubstituted fused polycyclic aromatic group or a substituted or unsubstituted aryloxy group; and Q represents a nitrogen atom, an oxygen atom or a sulfur atom, and when Q represents an oxygen atom or a sulfur atom, Q does not have Ru.

[4] The organic electroluminescent element according to [1],
wherein the general formula (B-1) is represented by the following general formulae (B-4), (B-5), (B-6), or (B-7),

[Chemical Formula 4]

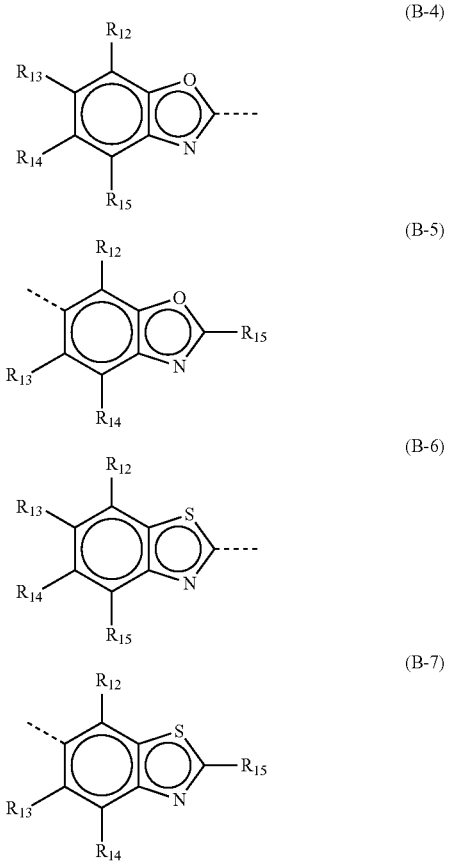

wherein in formulae (B-4), (B-5), (B-6) or (B-7), a broken line part is used as a binding site; $R_{12}$ to $R_{15}$ may be the same or different from each other, and each represents a hydrogen atom, a deuterium atom, a fluorine atom, a chlorine atom, a cyano group, a nitro group, a straight or branched alkyl group having 1 to 6 carbon atoms which may have a substituent, cycloalkyl group having 5 to 10 carbon atoms which may have a substituent, a straight or branched alkenyl group having 2 to 6 carbon atoms which may have a substituent, a straight or branched alkyloxy group having 1 to 6 carbon atoms which may have a substituent, a cycloalkyloxy group having 5 to 10 carbon atoms which may have a substituent, a substituted or unsubstituted aromatic hydrocarbon group, a substituted or unsubstituted aromatic ring group, a substituted or unsubstituted fused polycyclic aromatic group or a substituted or unsubstituted aryloxy group.

[5] The organic electroluminescent element according to [4],
wherein A, X and Z in the formula (A-1) comprise an amine compound having a benzazole ring structure.

[6] The organic electroluminescent element according to [4],
wherein A and X in the general formula (A-1) have a benzazole ring structure, and Z in the general formula (A-1) comprises an amine compound having a substituted or unsubstituted aromatic hydrocarbon group, a substituted or unsubstituted aromatic heterocyclic group, or a substituted or unsubstituted fused polycyclic aromatic group.

[7] The organic electroluminescent element according to [5],
wherein at least one of A, X and Z in the formula (A-1) comprises an amine compound having a benzazole ring structure represented by the formula (B-4) or (B-6).

[8] The organic electroluminescent element according to [5],
wherein at least one of A, X and Z in the formula (A-1) comprises an amine compound having a benzazole ring structure represented by the formula (B-5) or (B-7).

[9] The organic electroluminescent element according to [5],
wherein at least two of A, X and Z in the formula (A-1) comprise an amine compound having a benzazole ring structure represented by the formula (B-4) or (B-6).

[10] The organic electroluminescent element according to [5],
wherein at least two of A, X and Z in the formula (A-1) comprise an amine compound having a benzazole ring structure represented by the formula (B-5) or (B-7).

[11] The organic electroluminescent element according to [5], wherein A, X and Z in the formula (A-1) comprise an amine compound having a benzazole ring structure represented by the formula (B-4) or (B-6).

[12] The organic electroluminescent element according to [5],
wherein A, X and Z in the formula (A-1) comprise an amine compound having a benzazole ring structure represented by the formula (B-5) or (B-7).

[13] The organic electroluminescent element according to [6],
wherein at least one of A and X in the formula (A-1) comprises an amine compound having a benzazole ring structure represented by the formula (B-4) or (B-6).

[14] The organic electroluminescent element according to [6],
wherein at least one of A and X in the formula (A-1) comprises an amine compound having a benzazole ring structure represented by the formula (B-5) or (B-7).

[15] The organic electroluminescent element according to [6],
wherein A and X in the formula (A-1) comprise an amine compound having a benzazole ring structure represented by the formula (B-4) or (B-6).

[16] The organic electroluminescent element according to [6],
wherein A and X in the formula (A-1) comprise an amine compound having a benzazole ring structure represented by the formula (B-5) or (B-7).

[17] The organic electroluminescent element according to [6],
wherein A and X in the formula (A-1) comprise an amine compound having a benzazole ring structure represented by the formula (B-4) or (B-5).

[18] The organic electroluminescent element according to [6],
wherein A and X in the formula (A-1) comprise an amine compound having a benzazole ring structure represented by the formula (B-6) or (B-7).

[19] The organic electroluminescent element according to [5],
wherein A, X and Z in the formula (A-1) comprise an amine compound having the same benzazole ring structure.

[20] The organic electroluminescent element according to [6],
wherein A and X in the formula (A-1) comprise an amine compound having the same benzazole ring structure.

[21] The organic electroluminescent element according to [20],
wherein A and X in the general formula (A-1) are the same and comprise an amine compound having a benzazole ring structure represented by the general formula (B-4) or (B-5).

[22] The organic electroluminescent element according to [20],
wherein A and X in the general formula (A-1) are the same and comprise an amine compound having a benzazole ring structure represented by the general formula (B-6) or (B-7) is comprised.

[23] The organic electroluminescent element according to [5],
wherein the organic electroluminescent element comprises an amine compound having a benzazole ring structure in which A, X and Z in the general formula (A-1) are not the same.

[24] The organic electroluminescent element according to [6], further comprising an amine compound having a benzazole ring structure in which A and X in the formula (A-1) are not the same.

[25] The organic electroluminescent element according to [1],
wherein the capping layer has a thickness in the range of 30 nm to 120 nm.

[26] The organic electroluminescent element according to [1],
wherein a refractive index of the capping layer is 1.85 or more in the wavelength range of 450 nm to 750 nm of light transmitted through the capping layer.

[27] A method of producing an organic electroluminescent element according to [17],
wherein the capping layer of the organic electroluminescent element is formed by using an amine compound having a benzoxazole ring structure in which A and X in the general formula (A-1) are represented by the general formula (B-4) or (B-5).

[28] A method of producing an organic electroluminescent element according to [18],
wherein the capping layer of the organic electroluminescent element is formed by using an amine compound having a benzothiazole ring structure in which A and X in the general formula (A-1) are represented by the general formula (B-6) or (B-7).

[29] An organic electroluminescent element comprising an organic layer which comprises a luminous layer between a first electrode and a second electrode,
wherein a capping layer is laminated on an opposite surface of the first electrode with respect to the organic layer, and
the capping layer comprises a tertiary amine compound represented by general formula (A-2) having a benzazole ring structure,

[Chemical Formula 5]

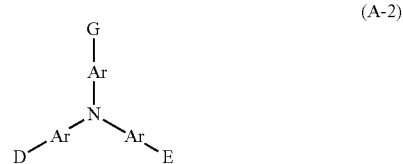

(A-2)

[Chemical Formula 6]

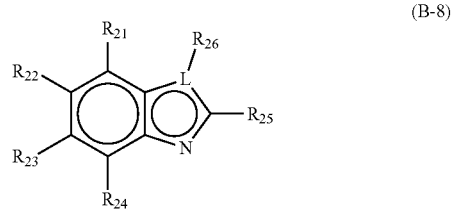

(B-8)

wherein in formula (A-2), each Ar represents a single bond, a divalent group of a substituted or unsubstituted aromatic hydrocarbon group, a divalent group of a substituted or unsubstituted aromatic heterocyclic group, or a divalent group of a substituted or unsubstituted fused polycyclic aromatic group; each of D and E represents a benzazole ring structure represented by formula (B-8); and G is a benzazole ring structure represented by formula (B-8), a substituted or unsubstituted aromatic hydrocarbon group, a substituted or unsubstituted aromatic heterocyclic group, or a substituted or unsubstituted fused polycyclic aromatic group, and in formula (B-8), $R_{21}$ to $R_{26}$ each represent a hydrogen atom, a deuterium atom, a fluorine atom, a chlorine atom, a cyano group, a nitro group, a linear or branched alkyl group having 1 to 6 carbon atoms which may have a substituent, a cycloalkyl group having 5 to 10 carbon atoms which may have a substituent, a linear or branched alkenyl group having 2 to 6 carbon atoms which may have a substituent, a linear or branched alkyloxy group having 1 to 6 carbon atoms which may have a substituent, a cycloalkyloxy group having 1 to 6 carbon atoms which may have a substituent, a substituted or unsubstituted aromatic hydrocarbon group having 5 to 10 carbon atoms, a substituted or unsubstituted aromatic heterocyclic group, a substituted or unsubstituted fused polycyclic aromatic group, and a substituted or unsubstituted polycyclic aromatic aromatic group, or a substituted or unsubstituted aryloxy group, and one of $R_{21}$ to $R_{26}$ is a linking group bonded to Ar in formula (A-2); and L is selected from a nitrogen atom, an oxygen atom, or a sulfur atom, and when L is selected from an oxygen atom or a sulfur atom, L does not have $R_{26}$.

[30] The organic electroluminescent element according to [29],
wherein the first electrode is a cathode.

[31] The organic electroluminescent element according to [29] or [30],
wherein the organic layer is a layer in which a luminous layer is disposed between a hole transport layer and an electron transport layer.

[32] The organic electroluminescent element according to any one of [29] to [31],
wherein Ar bonded to D and E in the tertiary amine compound represented by formula (A-2) is a p-phenylene group.

[33] The organic electroluminescent element according to [32],
wherein D and E in a tertiary amine compound represented by formula (A-2) are the same, and $R_{25}$ in a benzazole ring structure represented by formula (B-8) is a linking group bonded to Ar in formula (A-2).

[34] The organic electroluminescent element according to [33],
wherein each of $R_{21}$ to $R_{24}$ in the tertiary amine compound represented by general formula (A-2) is a hydrogen atom and L is an oxygen atom.

[35] The organic electroluminescent element according to [33],
wherein each of $R_{21}$ to $R_{24}$ in the tertiary amine compound represented by general formula (A-2) is a hydrogen atom and L is a sulfur atom.

[36] The organic electroluminescent element according to any one of [29] to [31]
wherein Ar bonded to G in the tertiary amine compound represented by the general formula (A-2) is a p-phenylene group.

[37] The organic electroluminescent element according to [36],
wherein G in the tertiary amine compound represented by formula (A-2) is an unsubstituted fused polycyclic aromatic group.

[38] The organic electroluminescent element according to any one of [29] to [31]
wherein Ar bonded to D and E in the tertiary amine compound represented by formula (A-2) is an m-phenylene group.

[39] The organic electroluminescent element according to [38],
wherein in the tertiary amine compound represented by the general formula (A-2), D and E are the same, and $R_{25}$ in the benzazole ring structure represented by the general formula (B-8) is a linking group bonded to Ar in the formula (A-2).

[40] The organic electroluminescent element according to [39],
wherein each of $R_{21}$ to $R_{24}$ in the tertiary amine compound represented by general formula (A-2) is a hydrogen atom and L is an oxygen atom.

[41] The organic electroluminescent element according to any one of claims [29] to [34],
wherein among three Ar in a tertiary amine compound represented by the general formula (A-2), Ar bonded to G is a single bond and G is a substituted or unsubstituted fluorene group.

[42] The organic electroluminescent element according to any one of claims [29] to [31],
wherein Ar in a tertiary amine compound represented by formula (A-2) is a single bond; G is a substituted or unsubstituted aromatic hydrocarbon group; and $R_{22}$ in the benzazole ring structure represented by formula (B-8), which is D or E, are bonded to N in formula (A-2).

[43] The organic electroluminescent element according to [41] or [42], wherein L in the benzazole ring structure represented by formula (B-8) is an oxygen atom.

[44] The organic electroluminescent element according to any one of [29] to [43],
wherein the tertiary amine compound represented by formula (A-2) has an absorbance of 0.2 to 1.5 at wavelengths of 400 nm and 410 nm at a concentration of $10^{-5}$ mol/L.

[45] The organic electroluminescent element according to any one of [29] to [44],
wherein the thickness of the capping layer is in the range of 30 nm to 120 nm.

[46] The organic electroluminescent element according to any one of [29] to [45],
wherein the capping layer has a refractive index of 1.85 to 3.00 and an extinction coefficient of 0.25 to 1.50 when a light having wavelengths of 400 nm and 410 nm is transmitted.

[47] A method of producing an organic electroluminescent element, the method comprising
forming an organic layer including a luminous layer between the first electrode and the second electrode; and
laminating a capping layer on an opposite surface of the first electrode with respect to the organic layer,
wherein the capping layer is formed by using a tertiary amine compound represented by general formula (A-2) having a benzazole ring structure,

[Chemical Formula 7]

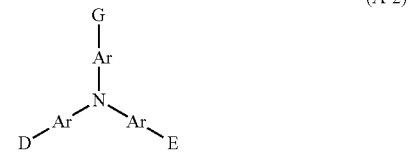

(A-2)

[Chemical Formula 8]

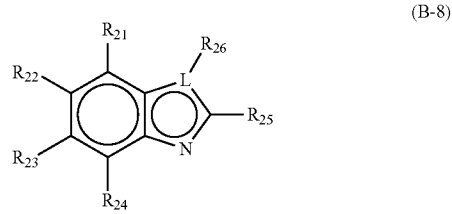

(B-8)

wherein in formula (A-2), Ar represents a single bond, a divalent group of a substituted or unsubstituted aromatic hydrocarbon group, a divalent group of a substituted or unsubstituted aromatic heterocyclic group, or a divalent group of a substituted or unsubstituted fused polycyclic aromatic group; D and E each represent a benzazole ring structure represented by formula (B-8); and G represents a benzazole ring structure represented by formula (B-8), a substituted or unsubstituted aromatic hydrocarbon group, substituted or unsubstituted aromatic heterocyclic group, or a substituted or unsubstituted fused polycyclic aromatic group, and
in formula (B-8), $R_{21}$ to $R_{26}$ each represent a hydrogen atom, a deuterium atom, a fluorine atom, a chlorine atom, a cyano group, a nitro group, a linear or branched alkyl group having 1 to 6 carbon atoms which may have a substituent, a cycloalkyl group having 5 to 10 carbon atoms which may have a substituent, a linear or branched alkenyl group having 2 to 6 carbon atoms which may have a substituent, a linear or branched alkyloxy group having 1 to 6 carbon atoms which may have a substituent, a cycloalkyloxy group having 1 to 6 carbon atoms which may have a substituent, a substituted or unsubstituted aromatic hydrocarbon group having 5 to 10 carbon atoms, a substituted or unsubstituted aromatic heterocyclic group, a substituted or unsubstituted fused polycyclic aromatic group, and a substituted or unsubstituted polycyclic aromatic aromatic group, or a substituted or unsubstituted aryloxy group; one of $R_{21}$ to $R_{26}$ is a linking group bonded to Ar in the formula (A-2); and L is selected from a nitrogen atom, an oxygen atom, or a sulfur atom, and when L is selected from an oxygen atom or a sulfur atom, L does not have $R_{26}$.

The organic EL element of the present disclosure has a high luminance, a good luminous efficiency and a good power efficiency, and a long life.

The organic EL element of the present disclosure can be manufactured according to the method of producing the organic EL element of the present disclosure.

BRIEF DESCRIPTION OF THE DRAWINGS

FIG. 1 is a schematic cross-sectional view showing an example of an organic EL element of the present embodiment.

DETAILED DESCRIPTION OF THE INVENTION

An object of the present disclosure is to improve element characteristics of an organic EL element. In particular, light having a wavelength of 400 nm to 410 nm of sunlight is absorbed so as not to affect the material inside the element. Further, light extraction efficiency is greatly improved. The present disclosure is related to an organic EL element having a capping layer composed of a material having a high absorption coefficient, a high refractive index, good stability of a thin film, excellent durability, excellent light resistance, and no absorption in the respective wavelength regions of blue, green, and red.

Physical characteristics of the material of the capping layer suitable for the present disclosure include (1) a high absorption coefficient, (2) a high refractive index, (3) vapor deposition capability, (4) stable thin film state, and (5) a high glass transition temperature.

Physical characteristics of the element suitable for the present disclosure include (1) absorption of light of 400 nm to 410 nm, (2) high light extraction efficiency, (3) no degradation in color purity, (4) transmission of light without change with time, and (5) long life.

"Organic EL Element"

An organic EL element of this embodiment has an organic layer including a luminous layer between a first electrode and a second electrode, and a capping layer is laminated on an opposite surface of the first electrode with respect to the organic layer.

The organic layer includes a luminous layer, and may be composed of only the luminous layer, or may have a laminated structure in which the luminous layer and other organic layers are laminated. The organic layer preferably has a luminous layer disposed between a hole transport layer and an electron transport layer because light emitting efficiency can be improved in a functional separation type structure.

The first electrode is an anode or a cathode. The second electrode is a cathode when the first electrode is an anode, and is an anode when the first electrode is a cathode.

The capping layer may be provided not only on the opposite surface of the first electrode with respect to the organic layer but also on an opposite surface of the second electrode with respect to the organic layer. The first electrode (and the second electrode) arranged to be in contact with the capping layer is preferably transparent or semitransparent to obtain an organic EL element having high light extraction efficiency.

As a structure of the organic EL element of the present disclosure, for example, in the case of a light-emitting element having a top emission structure, a multilayer structure in which an anode, a hole transport layer, a luminous layer, an electron transport layer, a cathode, and a capping layer are sequentially provided on a glass substrate can be used. In addition, a multilayer structure further having a hole injection layer between the anode and the hole transport layer, and a multilayer structure further having an electron blocking layer between the hole transport layer and the luminous layer, a multilayer structure further having a hole blocking layer between the luminous layer and the electron transport layer, and a multilayer structure further having an electron injection layer between the electron transport layer and the cathode can be used.

FIG. 1 is a schematic cross-sectional view showing an example of the organic EL element of the present embodiment. The organic EL element shown in FIG. 1 has a top emission structure in which an anode 2, a hole injection layer 3, a hole transport layer 4, a luminous layer 5, an electron transport layer 6, an electron injection layer 7, a cathode 8, and a capping layer 9 are laminated in this order on a glass substrate 1.

In these multilayer structures, it is possible to omit or combine several organic layers. For example, the hole injection layer and the hole transport layer may be combined, the hole transport layer and the electron blocking layer may be combined, the hole blocking layer and the electron transport layer may be combined, or the electron transport layer and the electron injection layer may be combined. It is also possible to have a structure in which two or more organic layers having the same function are laminated. For example, a configuration in which two hole transport layers are stacked, a configuration in which two luminous layers are stacked, a configuration in which two electron transport layers are stacked, a configuration in which two capping layers are stacked, and the like can be used.

Total film thickness of all layers of the organic EL element is preferably about 200 nm to 750 nm, more preferably about 350 nm to 600 nm.

"Capping Layer"

In the organic EL element of the present disclosure, a thickness of the capping layer is preferably in the range of 30 nm to 120 nm, and more preferably in the range of 40 nm to 80 nm. When the thickness of the capping layer is 30 nm or more, an effect of having the capping layer becomes significant and is therefore preferable. When the thickness of the capping layer is 120 nm or less, it is preferable because the thickness of the capping layer can be prevented from hindering the thinning of the organic EL element. When the film thickness of the capping layer is 30 nm to 120 nm, good light extraction efficiency is obtained.

The film thickness of the capping layer can be appropriately changed according to the type of the luminous material used for the luminous layer, the thickness of each layer of the organic EL element other than the capping layer, and the like.

In the organic EL element of the present disclosure, a refractive index of the capping layer is preferably 1.85 or higher and more preferably 1.90 or higher, when the wavelength of light transmitted through the capping layer is within the range of 450 nm to 750 nm.

The refractive index of the capping layer serves as an index for improving the light extraction efficiency of the organic EL element.

The refractive index of the capping layer is preferably larger than that of the adjacent electrodes. That is, although the light extraction efficiency in the organic EL element is improved by the capping layer, the effect is greater when the reflectance at the interface between the capping layer and the material in contact with the capping layer is large because the effect of light interference is large. Therefore, the refractive index of the capping layer is preferably larger than that of the adjacent electrodes, and the refractive index when light having wavelengths of 400 nm and 410 nm is transmitted is preferably 1.70 or more, more preferably 1.80 or more, and particularly preferably 1.85 or more.

The capping layer of the organic EL element of the present embodiment preferably has a refractive index of 2.20 to 3.00 when light having wavelengths of 400 nm and 410 nm is transmitted. An organic EL element having a capping layer having a refractive index of 2.20 or more when light having wavelengths of 400 nm and 410 nm is transmitted is preferable because the light extraction efficiency is high, the luminance is high, and the luminous efficiency and the power efficiency are excellent.

The capping layer of the organic EL element of the present embodiment preferably has an extinction coefficient of 0.25 to 1.50 when light having wavelengths of 400 nm and 410 nm is transmitted. The capping layer having an extinction coefficient of 0.25 or more when light having wavelengths of 400 nm and 410 nm is transmitted has a good function of absorbing light having wavelengths of 400 nm and 410 nm. Therefore, the organic EL element provided with the capping layer having the extinction coefficient of 0.25 or more has good light resistance, can maintain the color purity for a long period of time and can suppress deterioration of luminance; and as a result, has a long life.

The capping layer provided in the organic EL element of the present disclosure may be formed of only one thin film or may be formed by laminating two or more thin films of different materials.

The capping layer may be formed of only one kind of material or may contain two or more kinds of materials mixed together.

The capping layer of the organic EL element contains an amine compound having a benzazole ring structure represented by formulae (A-1) or (A-2). The amine compound can be formed into a film by a vapor deposition method, and the thin film can be formed by a known method such as a spin coating method or an ink jet method in addition to a vapor deposition method.

As the capping layer, a single layer formed by depositing these amine compounds alone may be used, or a single layer formed by mixing these amine compounds with other materials may be used. The capping layer may be formed by laminating layers formed of the compound alone, by laminating layers formed by mixing the compound with other materials, or by laminating the layers formed of the compound alone with the layer formed by mixing the compound with other materials.

"Compounds Represented by General Formulae (A-1) and (A-2)"

The capping layer provided in the organic EL element of this embodiment contains a tertiary amine compound represented by the above general formula (A-1) or (A-2) having a benzazole ring structure. The amine compounds having a benzazole ring structure represented by general formulae (A-1) and (A-2) are new compounds.

In the tertiary amine compound represented by the general formula (A-1), A and X in the formula have a benzazole ring structure represented by formula (B-1). In the tertiary amine compound represented by general formula (A-2), D and E in the formula have a benzazole ring structure represented by formula (B-8). Therefore, the tertiary amine compounds represented by formulae (A-1) and (A-2) have high absorbance at wavelengths from 400 nm to 410 nm, and can form thin films having high refractive index and extinction coefficient when light at wavelengths of 400 nm and 410 nm is transmitted. Therefore, the organic EL element of the present embodiment provided with the capping layer containing the tertiary amine compound represented by the general formulae (A-1) and (A-2) has high luminance, good light emission efficiency and power efficiency, and a long life.

Specifically, examples of "aromatic hydrocarbon group", "aromatic heterocyclic group" or "fused polycyclic aromatic group" in "substituted or unsubstituted aromatic hydrocarbon groups", "substituted or unsubstituted aromatic heterocyclic group", or "substituted or unsubstituted fused polycyclic aromatic groups", represented by Z, G, Ar, and $R_1$ to $R_{15}$, and $R_{21}$ to $R_{26}$ in formulae (A-1), (A-2), (B-1), (B-2), (B-3), (B-4), (B-5), (B-6), (B-7) and (B-8), include phenyl, biphenylyl, terphenylyl, naphthyl, anthracenyl, phenanthrenyl, fluorenyl, spirobifluorenyl, indenyl, pyrenyl, perylenyl, fluoranthenyl, triphenylenyl, pyridyl, pyrimidinyl, triazinyl, furyl, pyrrolyl, thienyl, isoquinolyl, benzofuranyl, benzothienyl, indolyl, carbazolyl, benzoxazolyl, benzothiazolyl, benzothiazolyl, a quinoxalinyl group, a benzimidazolyl group, a pyrazolyl group, a dibenzofuranyl group, a dibenzothienyl group, a naphthyridinyl group, a phenanthrolinyl group, an acridinyl group and a carbolinyl group, as well as other aryl groups having 6 to 30 carbon atoms or other heteroaryl group having 2 to 20 carbon atoms.

Specifically, examples of "linear or branched alkyl group of 1 to 6 carbon atoms", "cycloalkyl group of 5 to 10 carbon atoms", "linear or branched alkenyl group of 2 to 6 carbon atoms", "linear or branched alkyloxy group of 1 to 6 carbon atoms", "cycloalkyloxy group of 5 to 10 carbon atoms", or "aryloxy group" in "linear or branched alkyl group of 1 to 6 carbon atoms which may have a substituent", "cycloalkyl group of 5 to 10 carbon atoms which may have a substituent", "linear or branched alkenyl group of 2 to 6 carbon atoms which may have a substituent", "linear or branched alkyloxy group of 1 to 6 carbon atoms which may have a substituent", "cycloalkyloxy group of 5 to 10 carbon atoms which may have a substituent", or "substituted or unsubstituted aryloxy group", represented by $R_1$ to $R_{15}$, and $R_{21}$ to $R_{26}$ in formulae (B-1), (B-2), (B-3), (B-4), (B-5), (B-6), (B-7) and (B-8), include methyl group, ethyl group, n-propyl group, isopropyl group, n-butyl group, isobutyl group, tert-butyl group, n-pentyl group, isopentyl group, neopentyl group, n-hexyl group, cyclopentyl group, cyclohexyl group, 1-adamantyl group, 2-adamantyl group, vinyl group, allyl group, isopropenyl group, 2-butenyl group, methyloxy group, ethyloxy group, n-propyloxy group, cyclopentyloxy group, cyclohexyloxy group, cyclohexyloxy group, phenyloxy group, 1-adamantyloxy group, Examples include a tolyloxy group and a biphenyloxy group.

Specifically, examples of "substituent" in "substituted aromatic hydrocarbon group", "substituted aromatic heterocyclic group", "substituted fused polycyclic aromatic group", "linear or branched alkyl group of 1 to 6 carbon atoms which may have a substituent", "cycloalkyl group of 5 to 10 carbon atoms which may have a substituent", "linear or branched alkenyl group of 2 to 6 carbon atoms which may have a substituent", represented by Z, G, Ar and $R_1$ to $R_{15}$, $R_{21}$ to $R_{26}$ in general formulae (A-1), (A-2), (B-1), (B-2), (B-3), (B-4), (B-5), (B-6), (B-7) and (B-8), include deuterium atom, cyano group, nitro group; halogen atoms such as fluorine, chlorine, bromine, and iodine atoms; silyl groups such as trimethylsilyl and triphenylsilyl groups; linear or branched alkyl group of 1 to 6 carbon atoms, such as methyl, ethyl, or propyl; linear or branched alkyloxy groups of 1 to 6 carbon atoms, such as methyloxy, ethyloxy, and propyloxy groups; alkenyl groups such as vinyl and allyl groups; aryloxy groups such as phenyloxy and tolyloxy groups; arylalkyloxy groups such as benzyloxy groups and phenetyloxy groups; aromatic hydrocarbon groups or fused polycyclic aromatic groups such as phenyl, biphenylyl, terphenylyl, naphthyl, anthracenyl, phenanthrenyl, fluorenyl, spirobifluorenyl, indenyl, pyrenyl, perylenyl, fluoranthenyl, triphenylenyl; pyridyl group, thienyl group, furyl group, pyrrolyl group, quinolyl group, isoquinolyl group, benzofuranyl group, benzothienyl group, indolyl group, carbazolyl group, benzoxazolyl group, benzothiazolyl group, quinoxalinyl group, benzimidazolyl group, pyrazolyl group, dibenzofuranyl group, dibenzothienyl group, and carbolinyl group, as well as other aryl groups having 6 to 30 carbon atoms or other heteroaryl groups having 2 to 20 carbon atoms, and these substituents may further be substituted with the exemplified substituents. Further, these substituents and the substituted benzene ring or the substituents substituted in the same benzene ring may be mutually bonded via a single bond, a substituted or unsubstituted methylene group, an oxygen atom or a sulfur atom to form a ring.

In the organic EL element of the present disclosure, Ar in the general formulae (A-1) and (A-2) is preferably a single bond or a divalent group of a substituted or unsubstituted aromatic hydrocarbon group, and more preferably a divalent group of a substituted or unsubstituted phenyl group.

In the present embodiment, Ar bonded to D and E in the tertiary amine compound represented by the general formula (A-2) is preferably a p-phenylene group or an m-phenylene group, more preferably a p-phenylene group. Since the tertiary amine compound has a high refractive index, an organic EL element having a capping layer containing the tertiary amine compound has an effect of obtaining higher light extraction efficiency.

When Ar bonded to D and E in the tertiary amine compound represented by formula (A-2) is a p-phenylene group or an m-phenylene group, it is preferable that D and E in formula (A-2) be the same and $R_{25}$ in the benzazole ring structure represented by formula (B-8) be a linking group bonded to Ar in formula (A-2). Since the tertiary amine compound has a high refractive index, the organic EL element having a capping layer containing the tertiary amine compound has an effect of obtaining higher light extraction efficiency.

Further, when Ar bonded to D and E in the tertiary amine compound represented by the general formula (A-2) is a p-phenylene group or an m-phenylene group, D and E in the formula (A-2) are the same, and $R_{25}$ in the benzazole ring structure represented by the general formula (B-8) is a linking group bonded to Ar in the formula (A-2), it is preferable that $R_{21}$ to $R_{24}$ in the formula (A-2) be both hydrogen atoms and L be an oxygen atom or a sulfur atom. Since the tertiary amine compound has a high refractive index, the organic EL element having a capping layer containing the tertiary amine compound has an effect of obtaining higher light extraction efficiency.

As the tertiary amine compound represented by formula (A-2), Ar bonded to G in formula (A-2) is preferably a p-phenylene group. Since the tertiary amine compound has a high refractive index, the organic EL element having a capping layer containing the tertiary amine compound has an effect of obtaining higher light extraction efficiency.

In the tertiary amine compound represented by general formula (A-2), when Ar bonded to G in formula (A-2) is a p-phenylene group, it is preferable that G in formula (A-2) be an unsubstituted fused polycyclic aromatic group. Since the tertiary amine compound has a high refractive index, the organic EL element having a capping layer containing the tertiary amine compound has an effect of obtaining higher light extraction efficiency.

In the tertiary amine compound represented by the general formula (A-2), among three Ar in in the formula (A-2), Ar bonded to G may be a single bond and G may be a substituted or unsubstituted fluorene group. Since the tertiary amine compound has a high refractive index, the organic EL element having a capping layer containing the tertiary amine compound has an effect of obtaining higher light extraction efficiency.

The tertiary amine compound represented by formula (A-2) may be a compound in which all Ar in formula (A-2) is a single bond, G is a substituted or unsubstituted aromatic hydrocarbon group, and $R_{22}$ in a benzazole ring structure represented by formula (B-8) is bonded to N in formula (A-2). Since the tertiary amine compound has a high refractive index, the organic EL element having a capping layer containing the tertiary amine compound has an effect of obtaining higher light extraction efficiency.

In the tertiary amine compound in which all Ar in formula (A-2) is a single bond, G is a substituted or unsubstituted aromatic hydrocarbon group, and $R_{22}$ in a benzazole ring structure represented by formula (B-8), which are D or E, is bonded to N in formula (A-2), $R_{24}$ and $R_{25}$ in the benzazole ring structure represented by formula (B-8) are preferably phenyl groups. Since the tertiary amine compound has a high refractive index, the organic EL element having a capping layer containing the tertiary amine compound has an effect of obtaining higher light extraction efficiency.

Q in the general formula (A-1) and L in the general formula (A-2) are selected from a nitrogen atom, an oxygen atom or a sulfur atom; and an oxygen atom or a sulfur atom is preferable because an oxygen atom or a sulfur atom has higher refractive index characteristics.

As specific examples of preferred compounds among the compounds represented by formulae (A-1) or (A-2) suitably used in the organic EL element of the present disclosure, compounds represented by the following formulae (1) to (85) are shown below. The compounds represented by the general formulae (A-1) and (A-2) are not limited to the compounds represented by the following formulae (1) to (85).

[Chemical Formula 9]
(1)
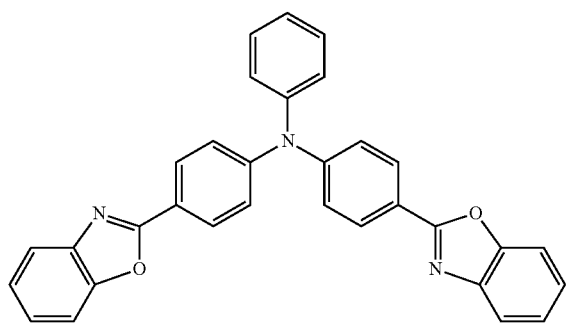
(2)
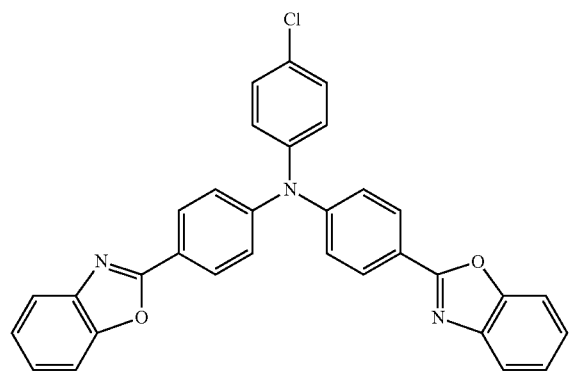
(3)
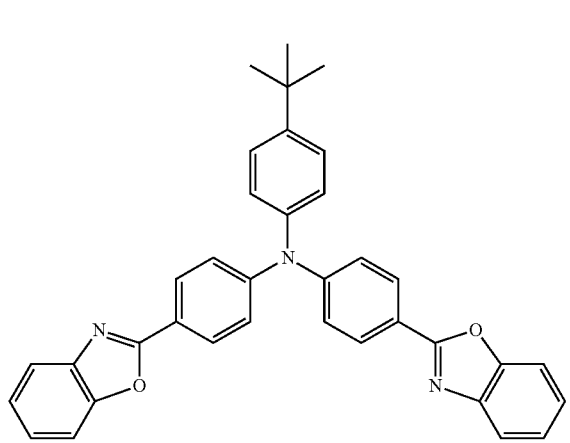
(4)
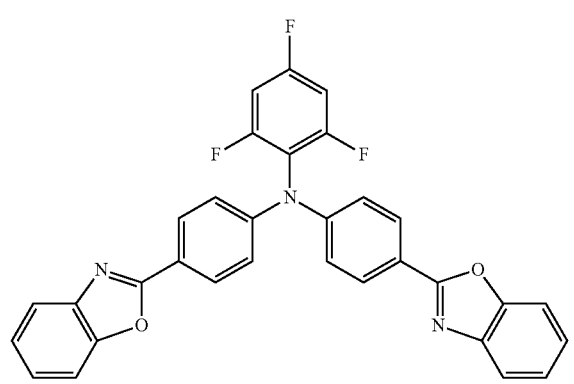
(5)
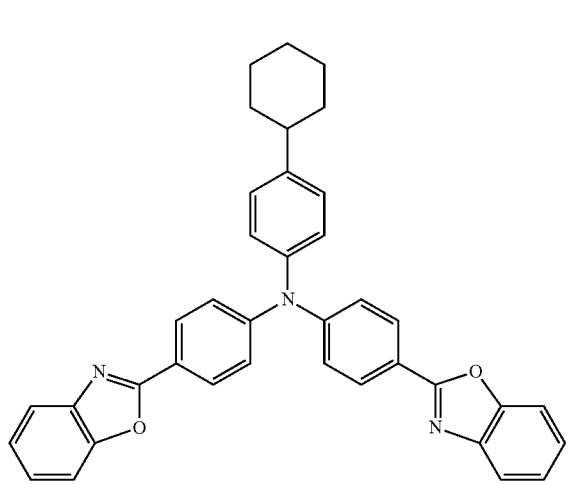
(6)
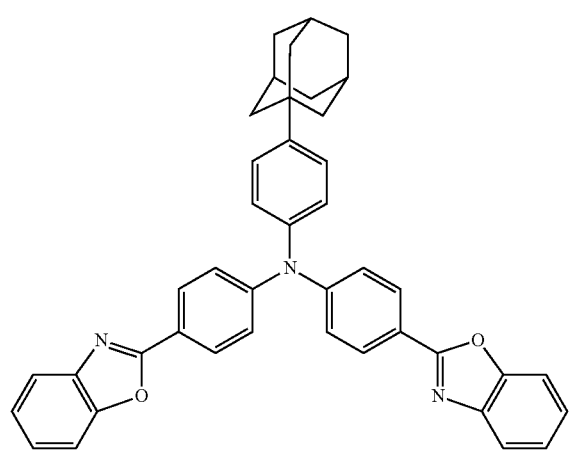

-continued
(7)
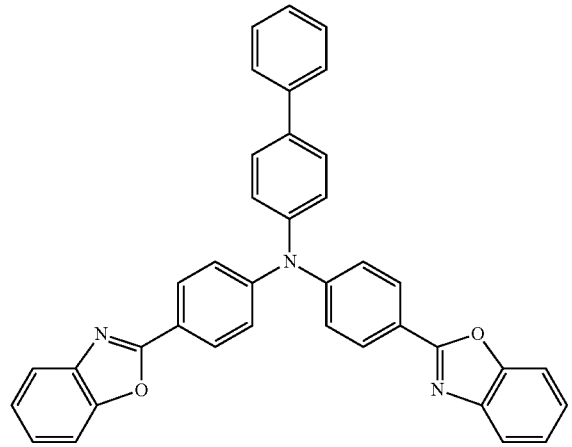
(8)
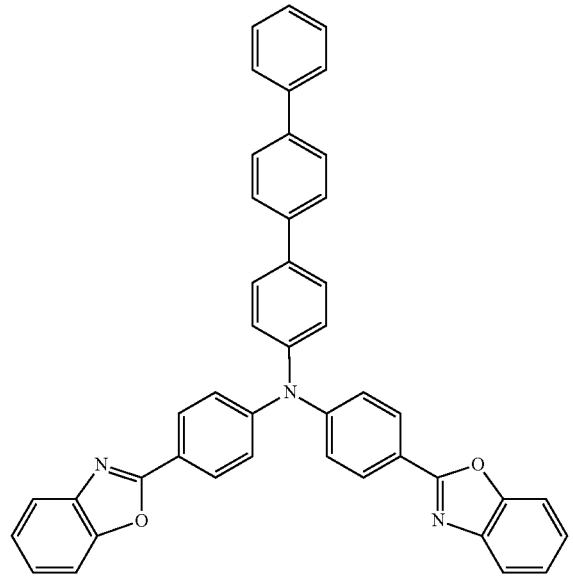
(9)
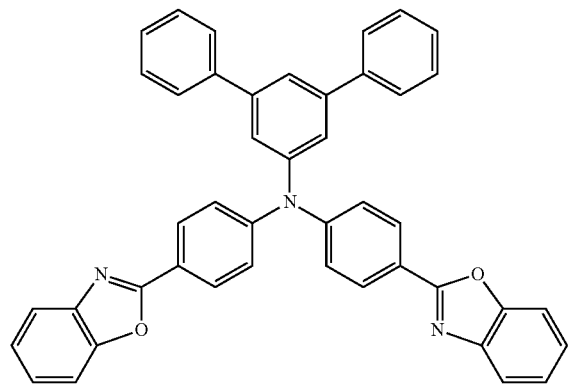
(10)
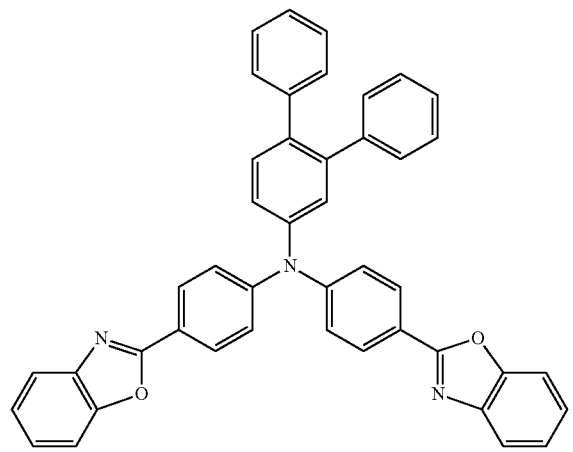
(11)
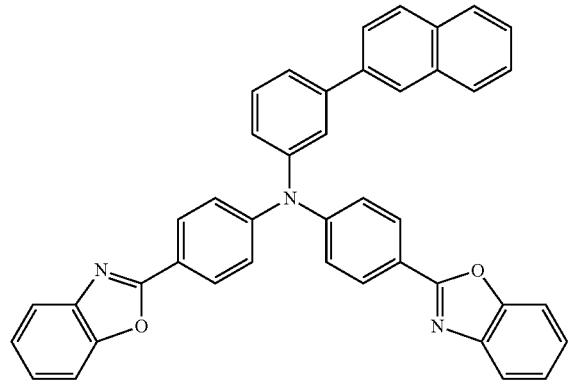
(12)
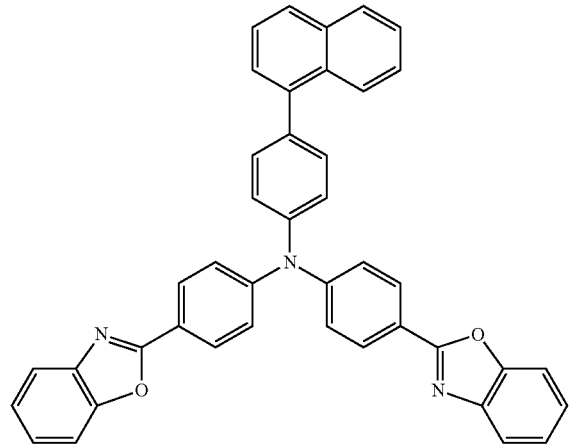

-continued
[Chemical Formula 10]
(13)
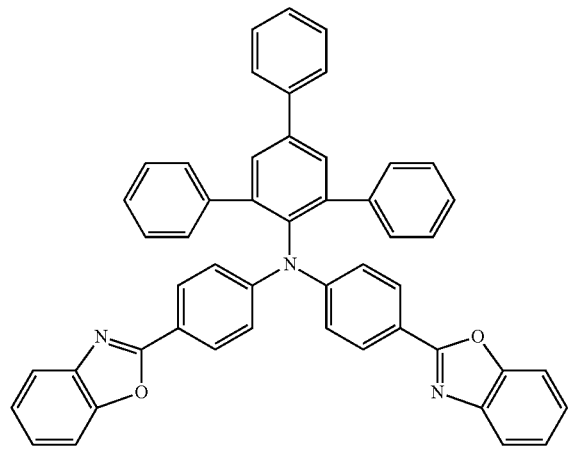
(14)
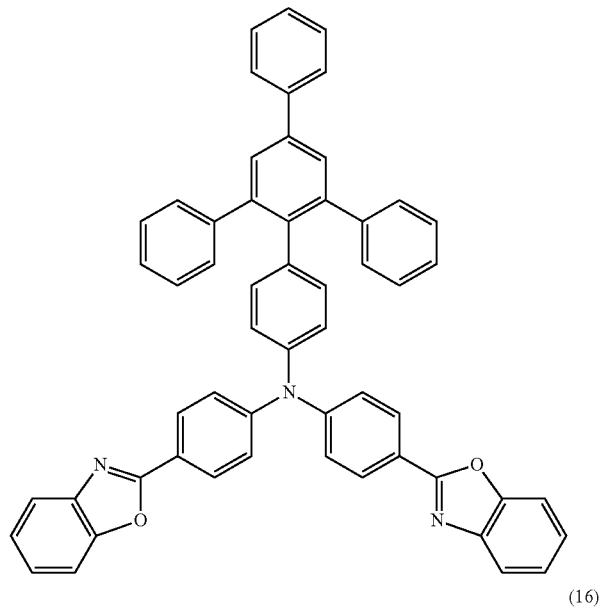
(15)
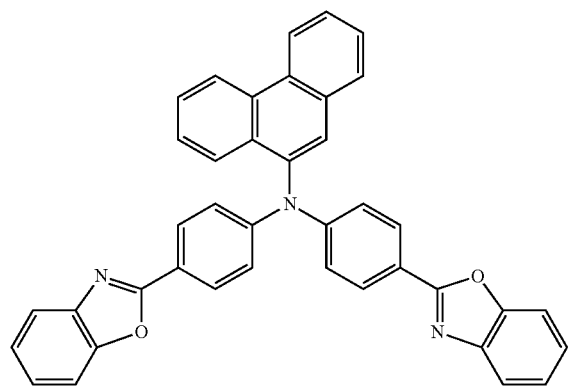
(16)
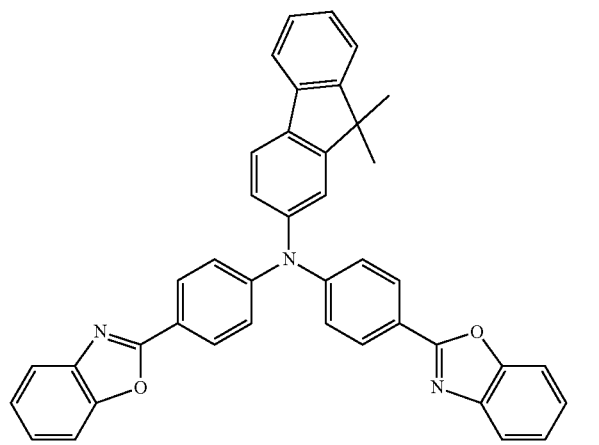
(17)
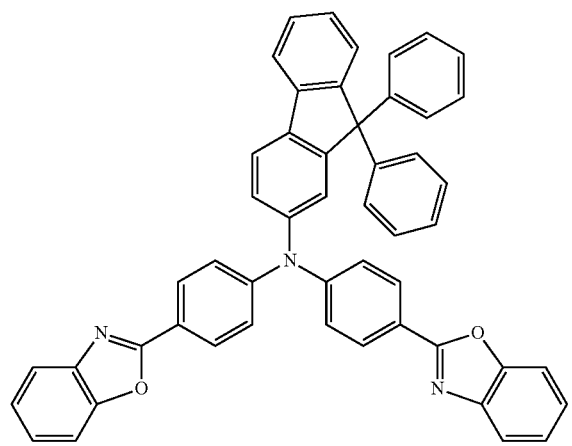
(18)
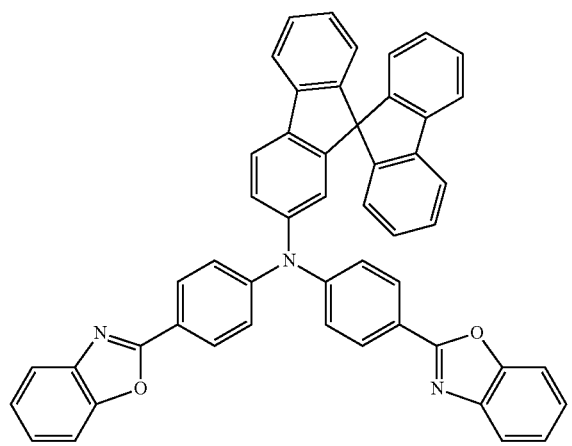

-continued
(19)
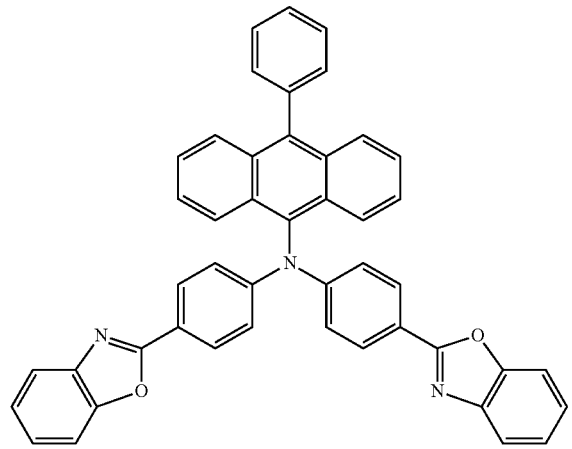
(20)
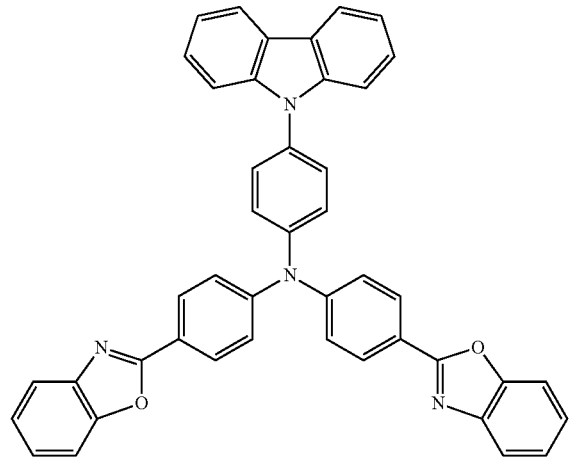
(21)
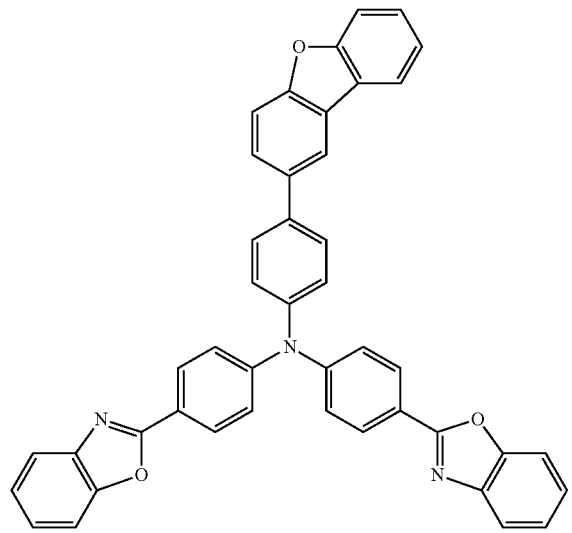
(22)
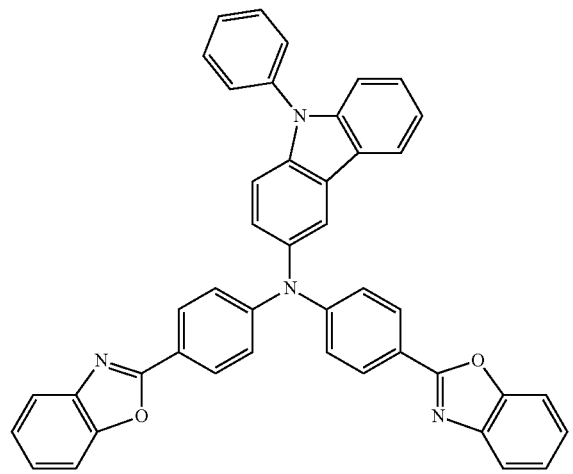
(23)
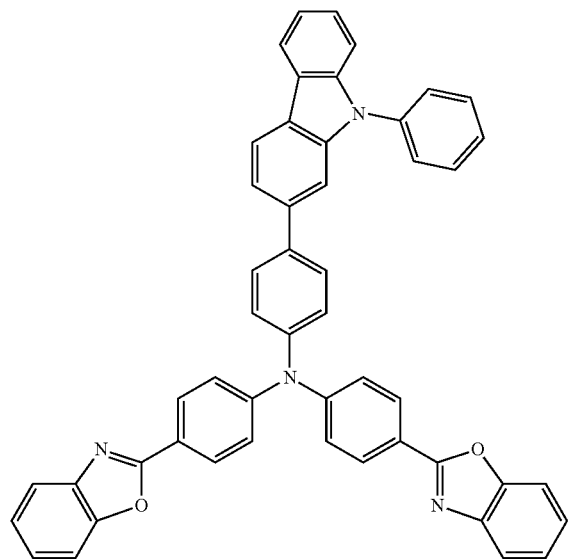
(24)
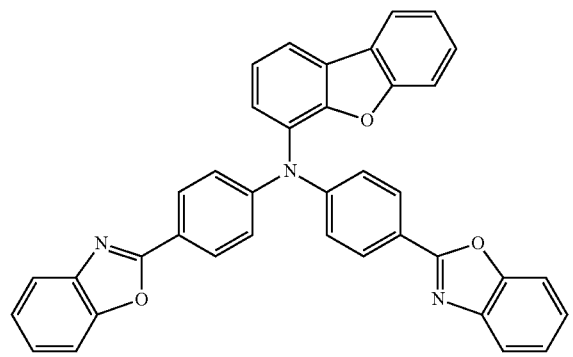

[Chemical Formula 11]
(25)
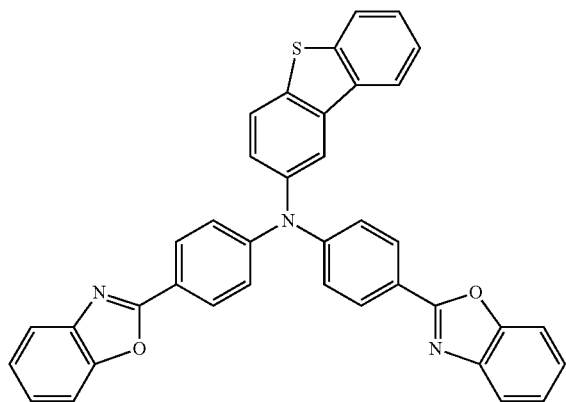
(26)
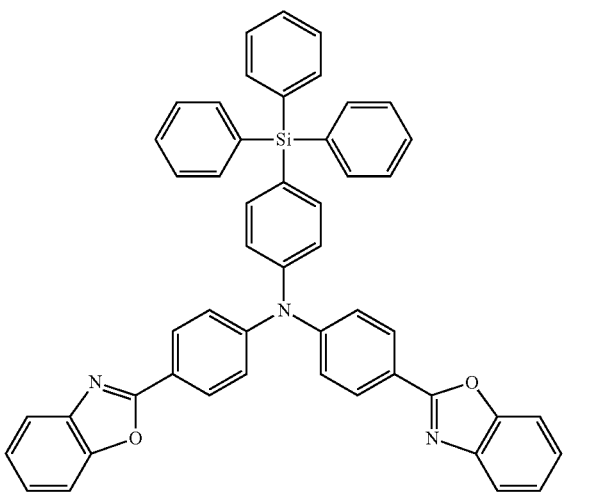
(27)
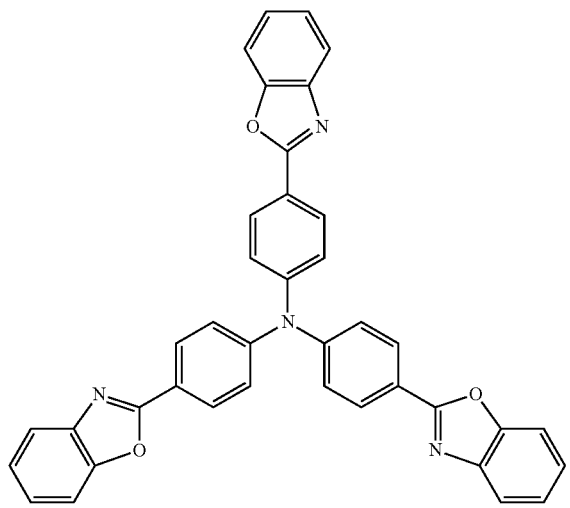
(28)
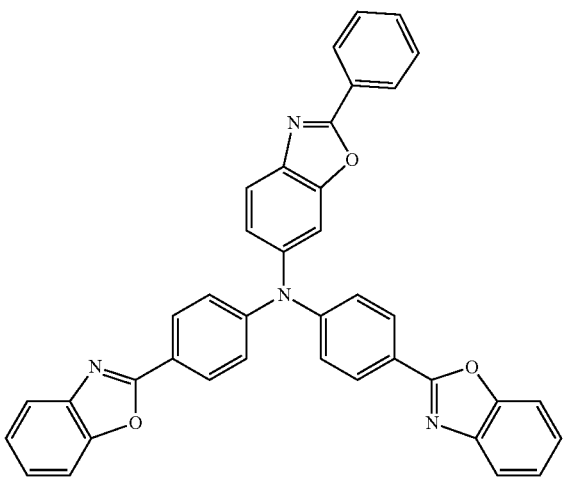
(29)
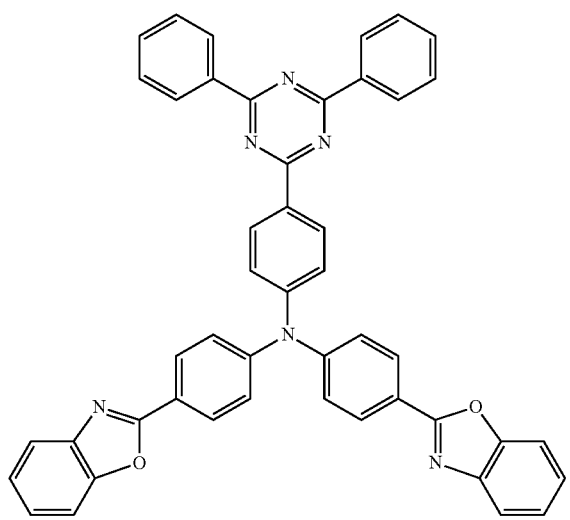

(30)
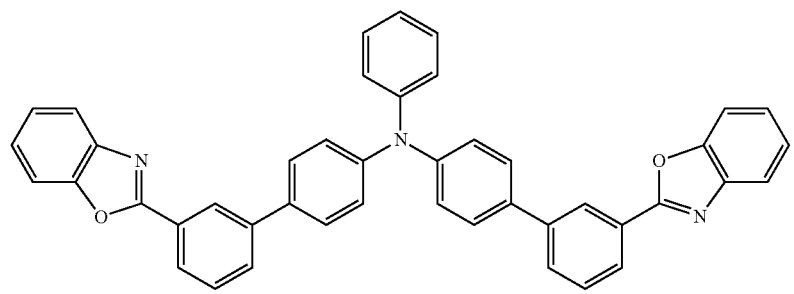
(31)
(32)
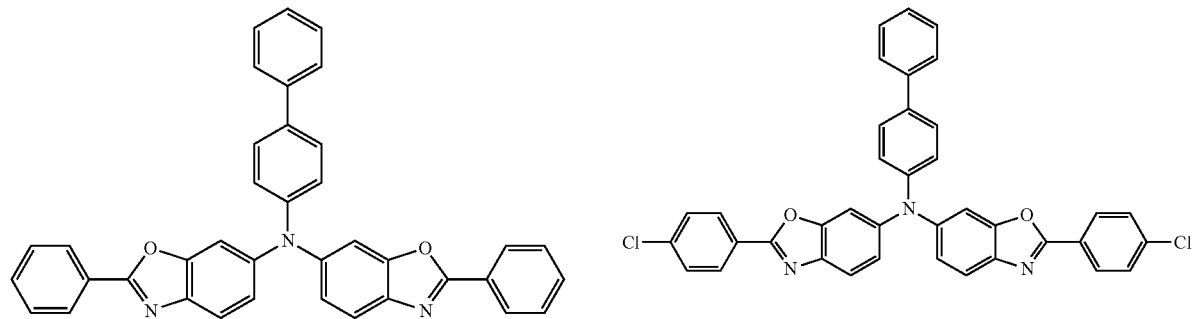
(33)
(34)
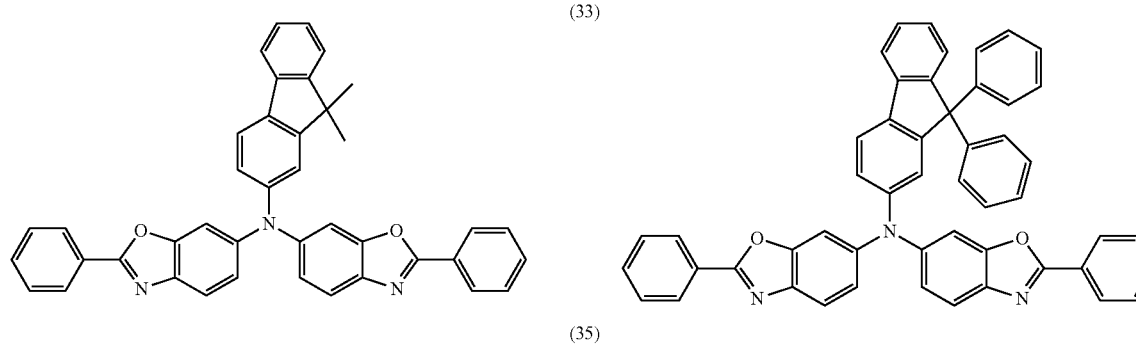
(35)
(36)
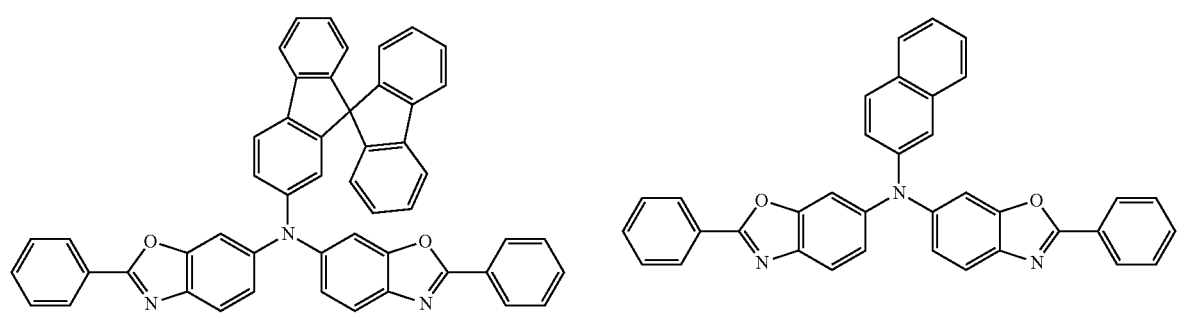
(37)
(38)
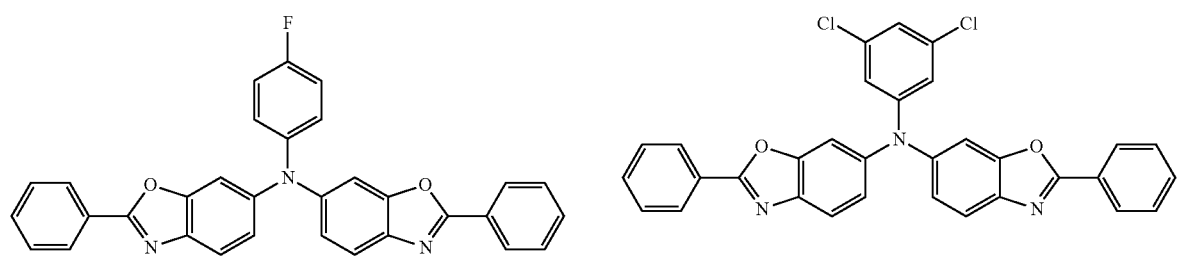

-continued
(39)
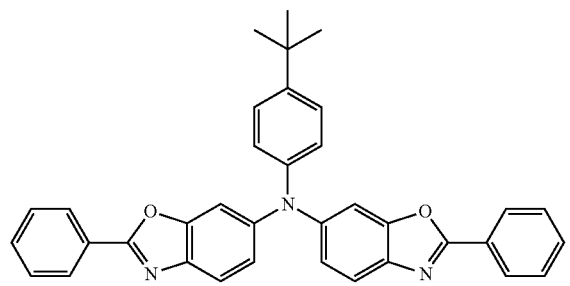
[Chemical Formula 12]
(40)
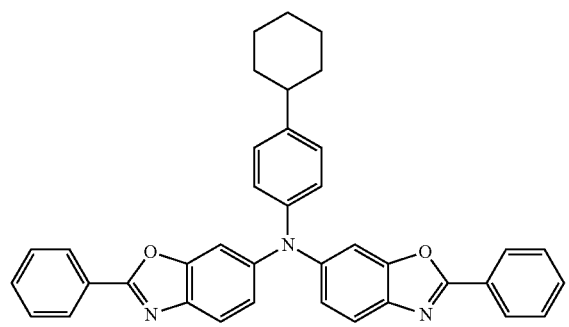
(41)
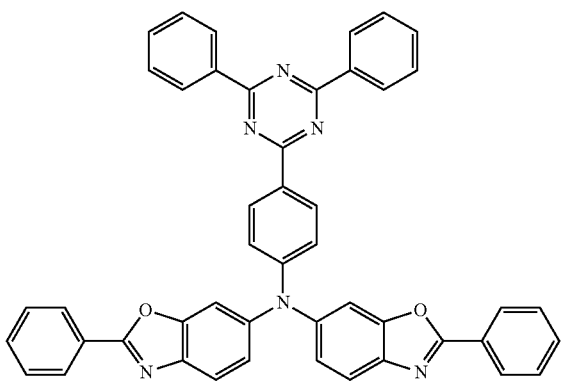
(42)
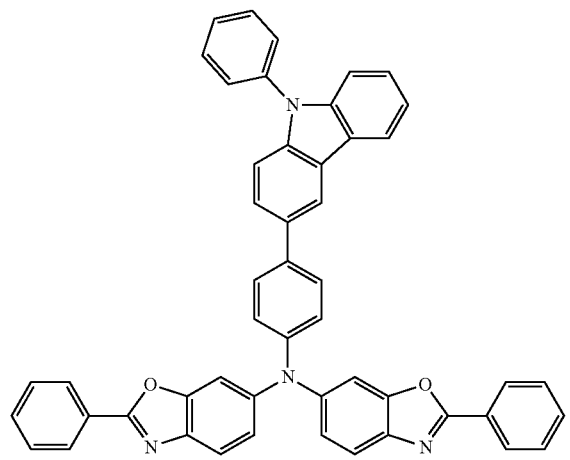
(43)
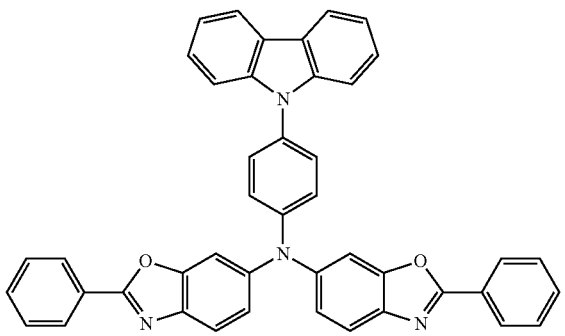
(44)
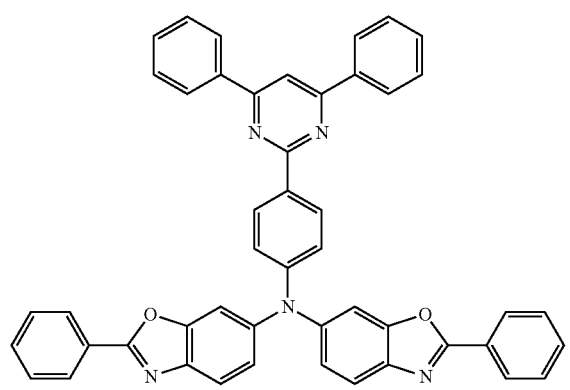
(45)
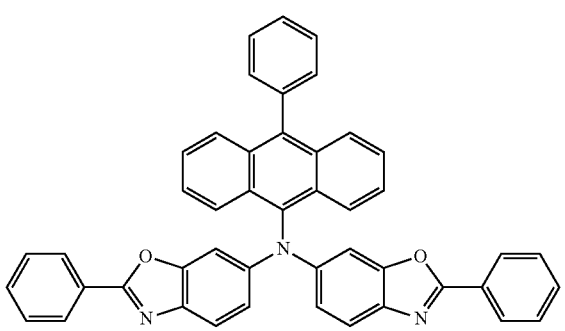

-continued
(46)
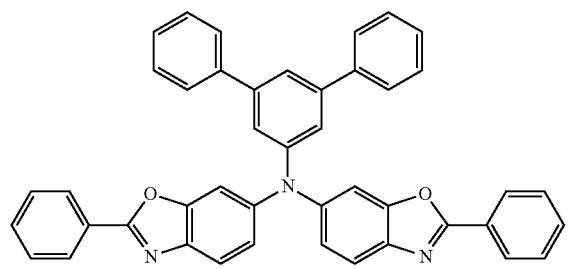
(47)
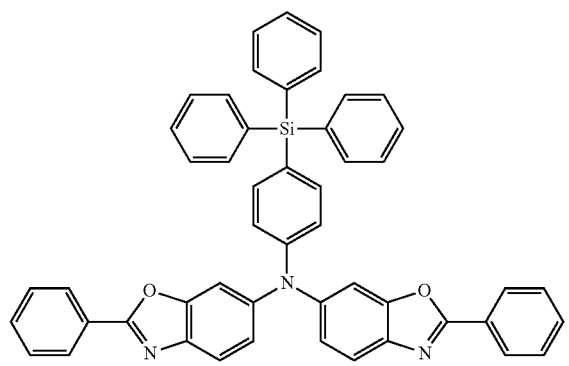
(48)
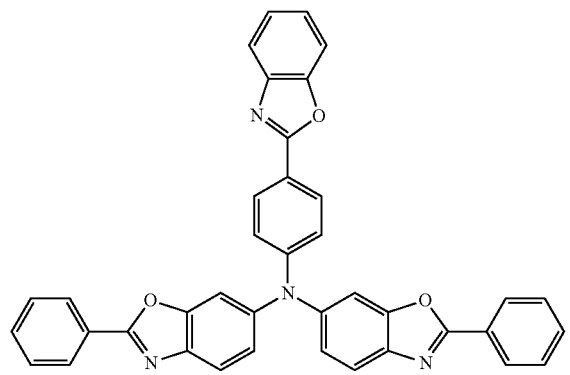
(49)
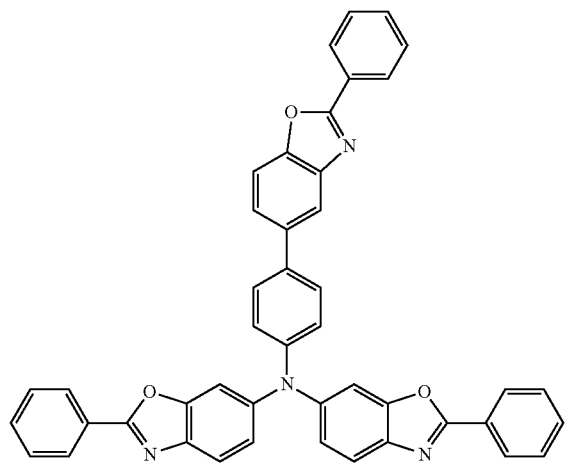
(50)
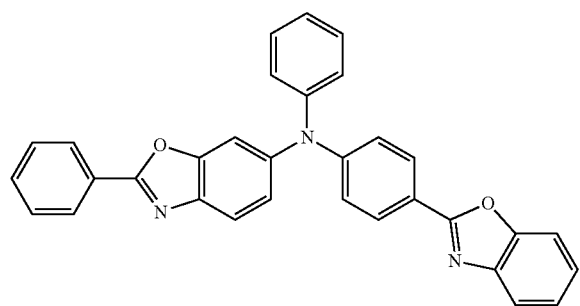
(51)
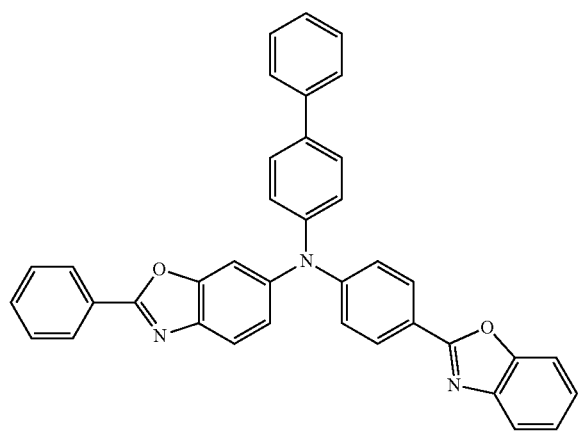

(52)
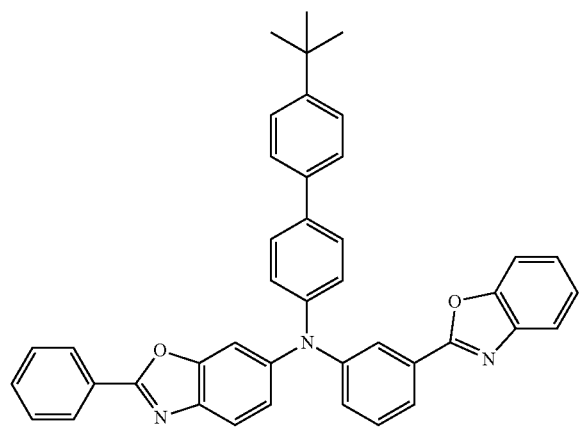
(53)
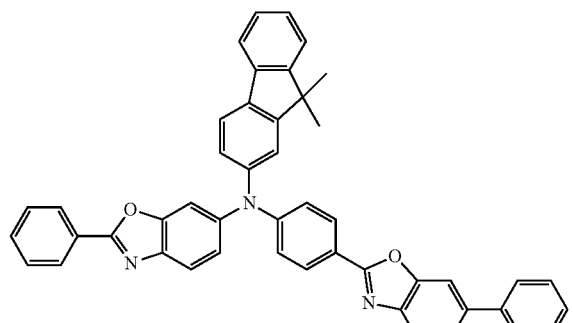
(54)
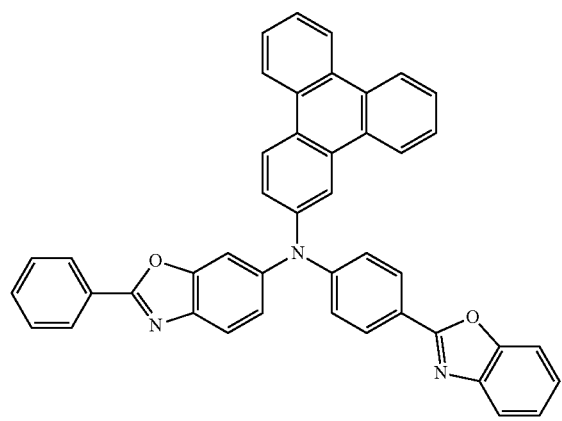
[Chemical Formula 13]
(55)
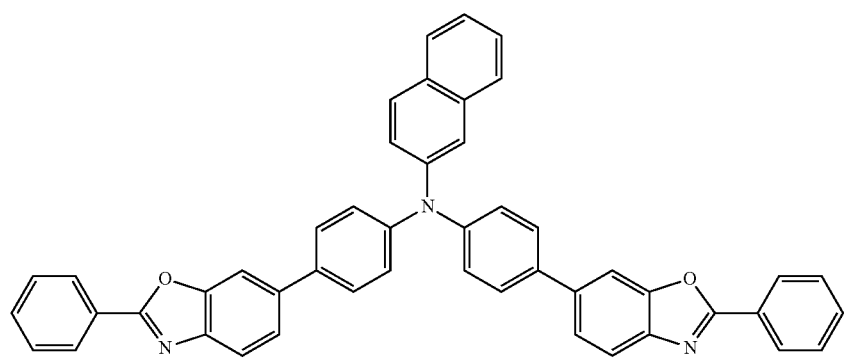
(56)
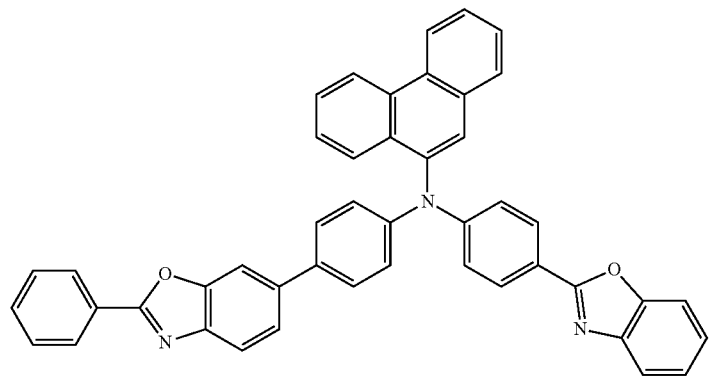

(57)
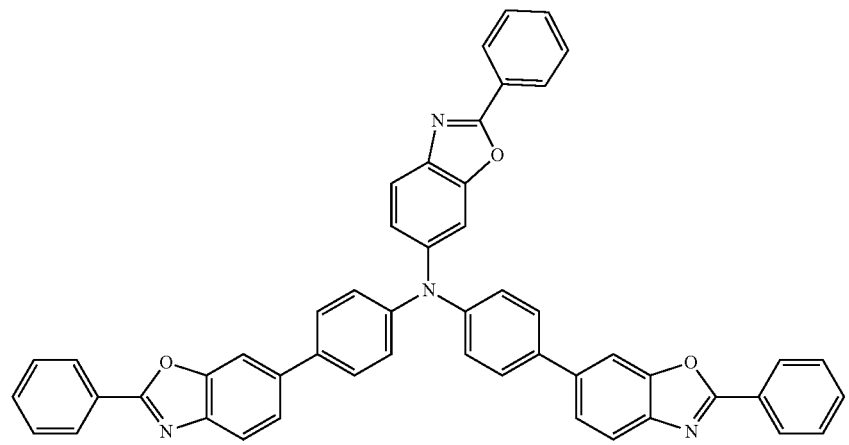
(58) (59)
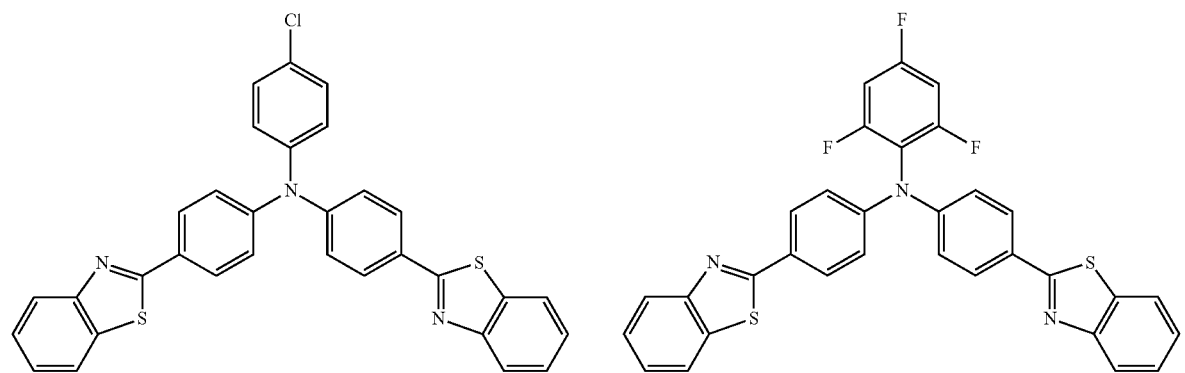
(60) (61)
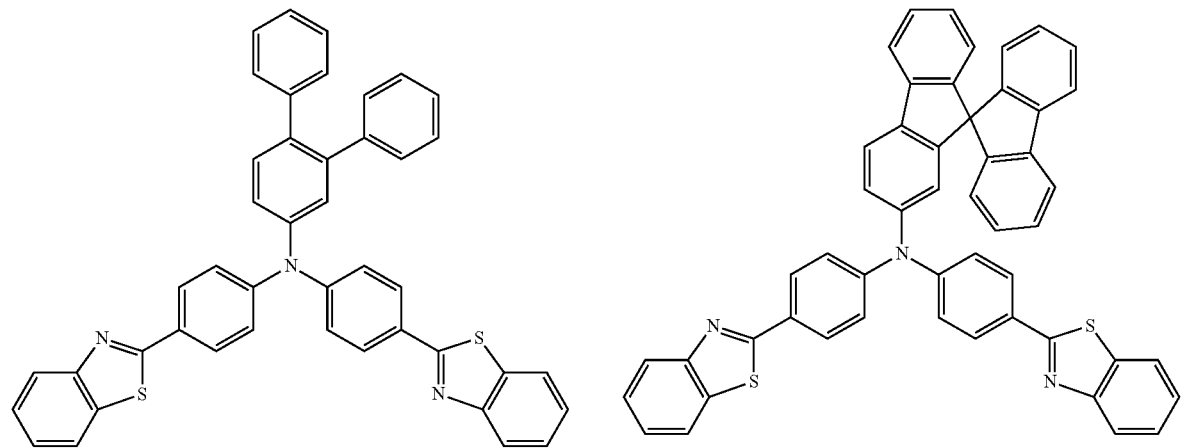

-continued
(62)
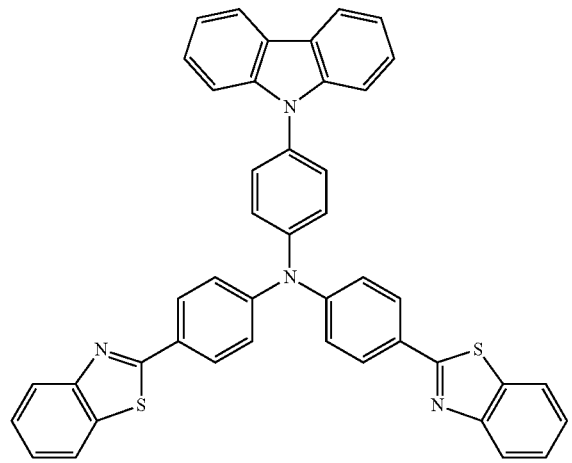
(63)
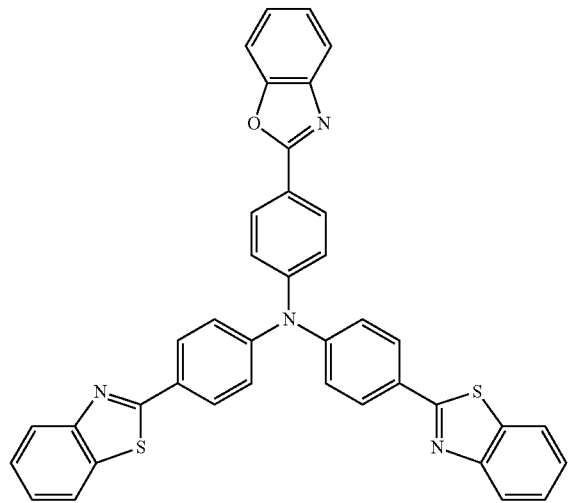
(64)
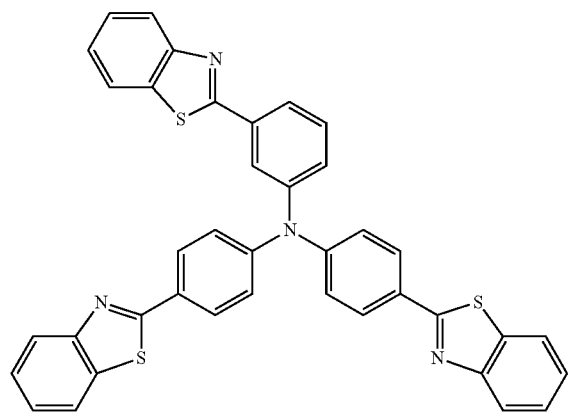
(65)
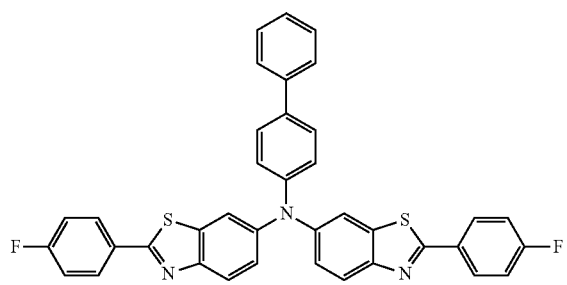
(66)
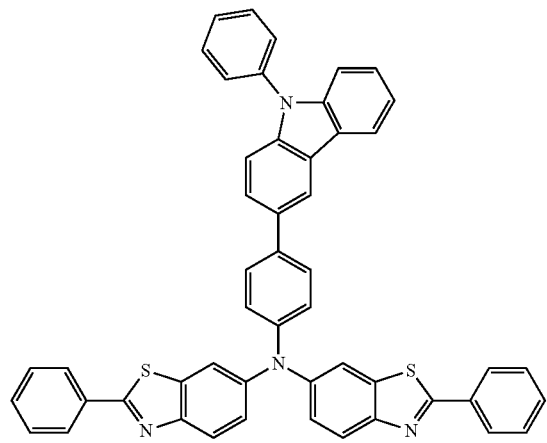
(67)
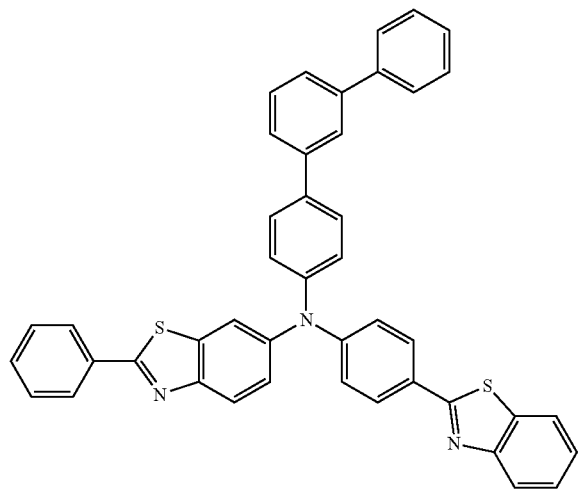

-continued
(68)
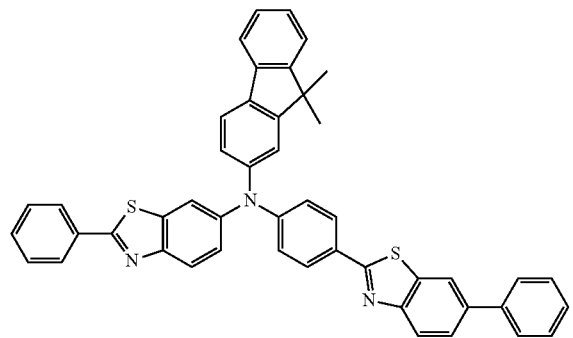
(69)
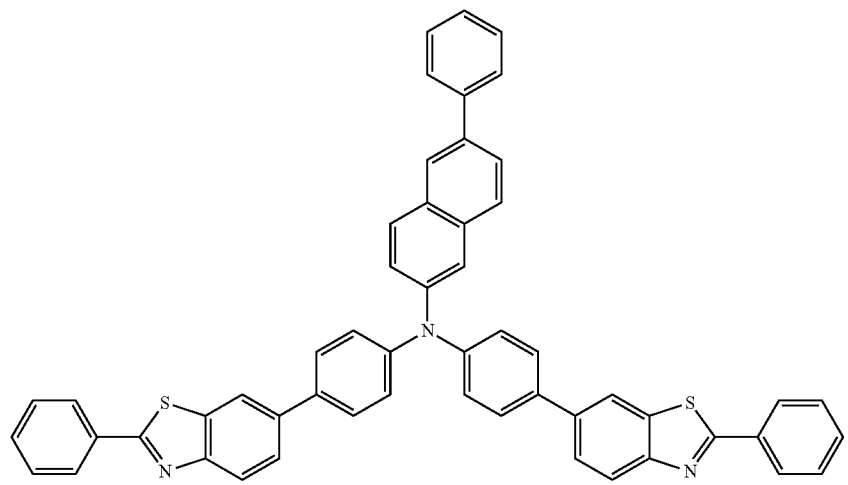
[Chemical Formula 14]
(70)
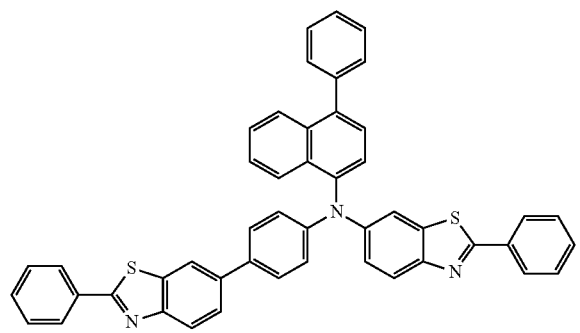
(71)
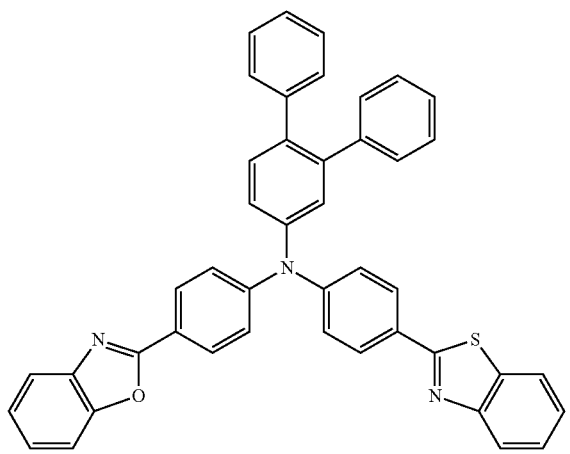

-continued
(72)
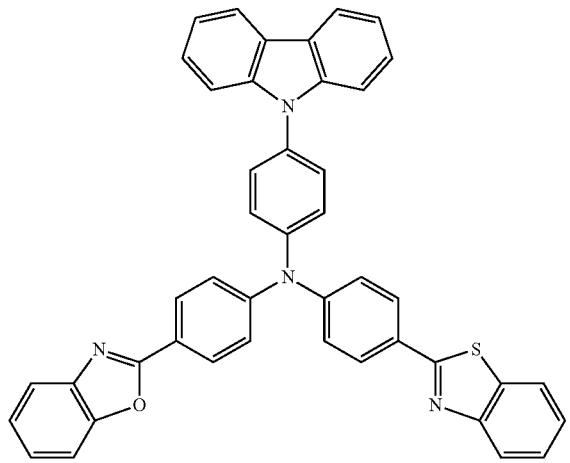
(73)
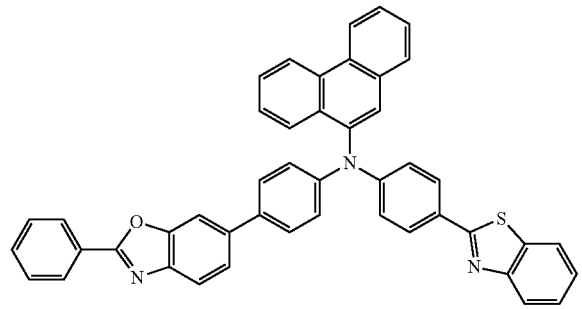
(74)
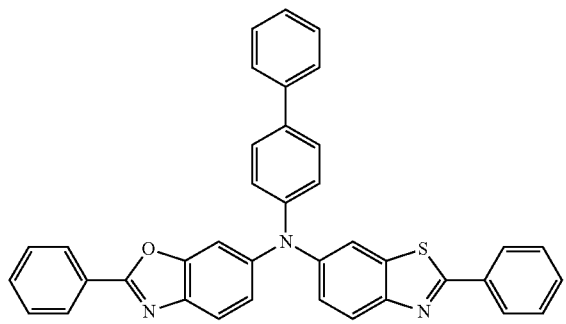
(75)
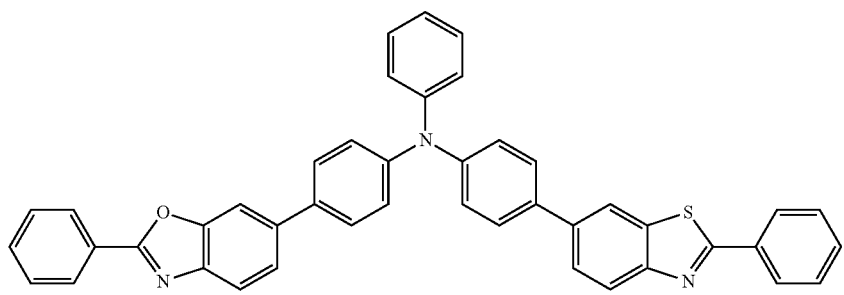

[Chemical Formula 15]
(76)
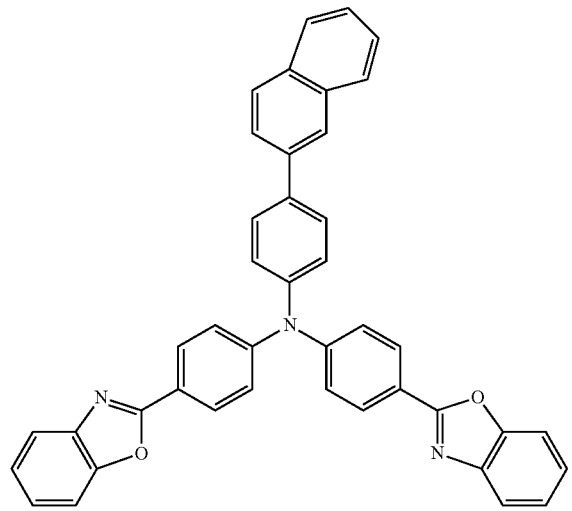
(77)
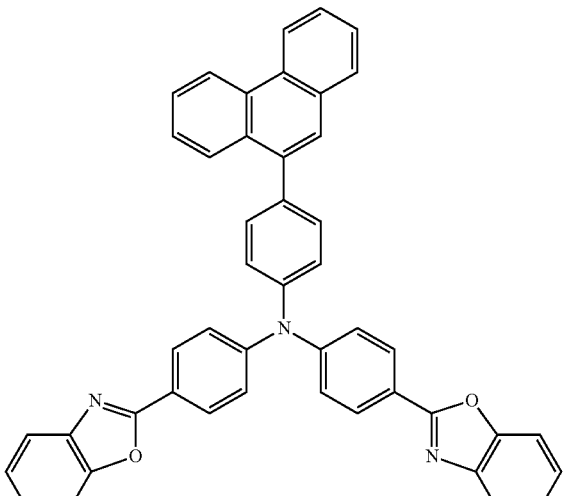
(78)
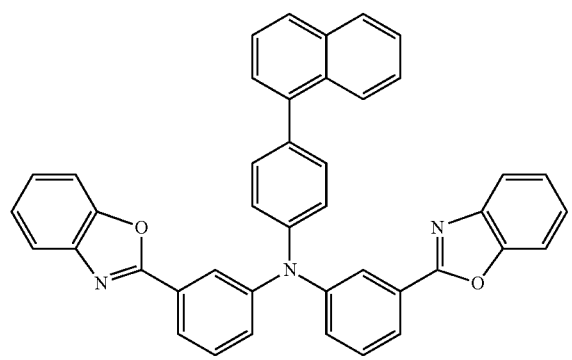
(79)
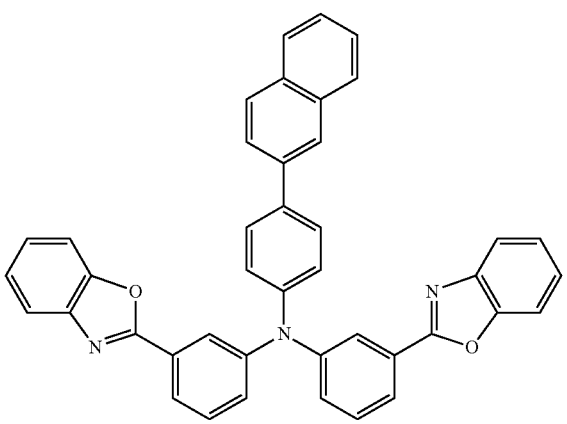
(80)
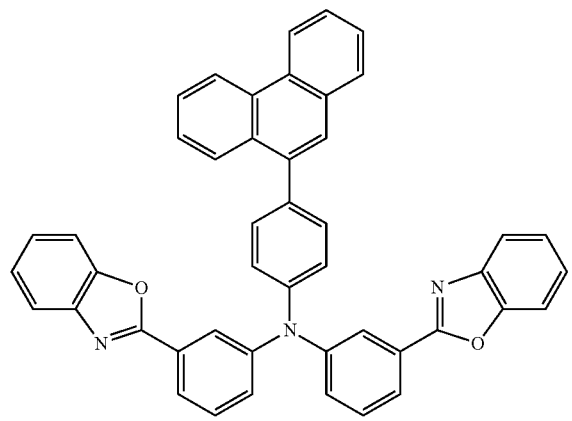
(81)
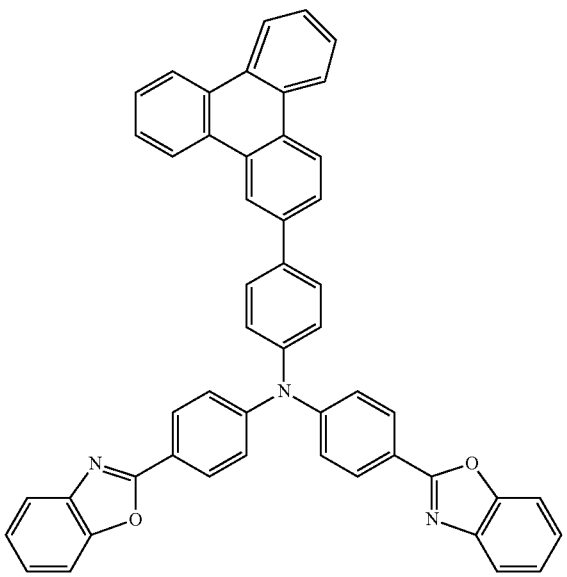

(82)

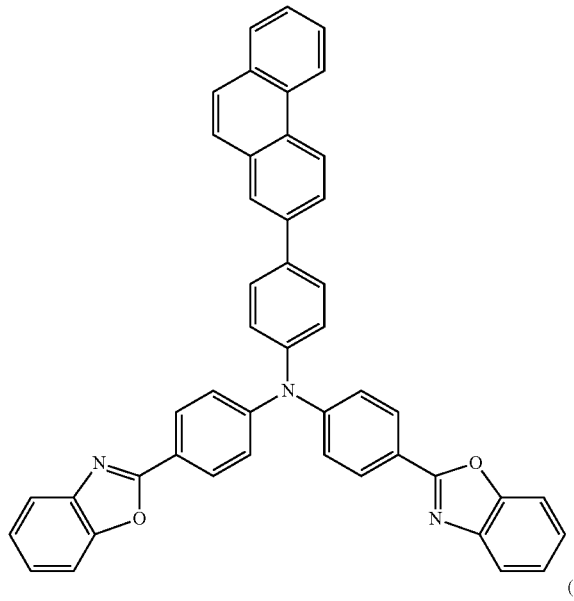

(83)

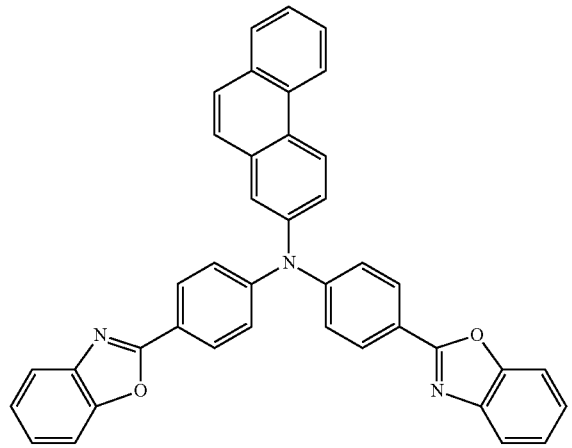

(84)

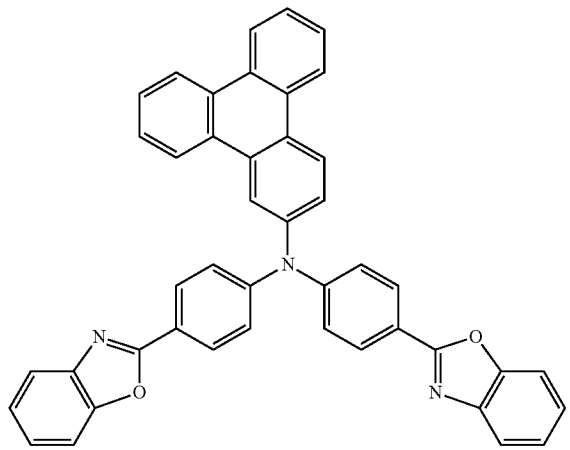

(85)

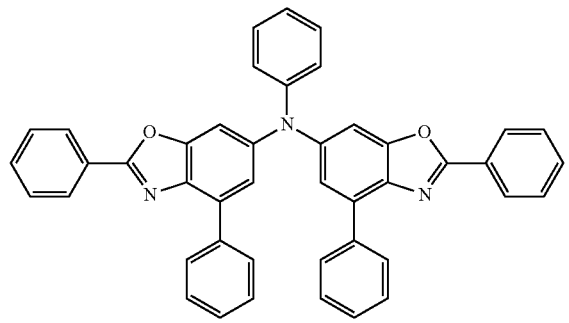

As the material of the capping layer, among the compounds represented by formulae (1) to (85), one or more compounds selected from compounds represented by formulae (10), (12), (16), (17), (60), (76), (77), (78), (79), (80) and (85) are preferably used.

These compounds have an absorbance of 0.2 or more at wavelengths of 400 nm and 410 nm at a concentration of $10^5$ mol/L, and have a good function of absorbing light at wavelengths of 400 nm and 410 nm. Further, these compounds can form a film having a thickness of 30 nm to 120 nm, a refractive index of 2.20 or more when light having wavelengths of 400 nm and 410 nm is transmitted, and an extinction coefficient of 0.25 or more by a vapor deposition method.

Therefore, by using any one or more compounds selected from the compounds represented by the formulae (10) (12) (16), (17), (60), (76), (77), (78), (79), (80), and (85), as the material of the capping layer, the organic EL element having higher luminance, better light emission efficiency and power efficiency, and longer life can be obtained.

As the material of the capping layer, in particular, it is preferable to use any one kind or two or more kinds selected from compounds represented by formulae (12), (76), (60) and (77). These compounds have a high absorbance of light with wavelengths from 400 nm to 410 nm, and can form films with a higher refractive index and extinction coefficient when light with wavelengths of 400 nm and 410 nm is transmitted by a vapor deposition method. Therefore, it is preferable as a material of the capping layer.

The compounds represented by formulae (A-1) and (A-2) preferably have a glass transition point (Tg) of 100° C. or higher. The glass transition temperature (Tg) of the compound is an indicator of stability of the thin film state. When the glass transition point (Tg) of the compound is within the above range, a thin film having good stability can be formed, and therefore, it is preferable as a material for the capping layer. The organic EL element provided with the capping layer having good stability has a long life and is preferable.

Melting points and glass transition points (Tg) of the compounds represented by formulae (A-1) and (A-2) in this embodiment are measured by a highly sensitive differential scanning calorimeter (DSC 3100 SA, manufactured by Bulker AXS) using powder of the compound.

The compounds represented by the general formulae (A-1) and (A-2) are preferably those having an absorbance of 0.2 to 1.5 at wavelengths of 400 nm and 410 nm at a concentration of $10^{-5}$ mol/L, and more preferably those having an absorbance of 0.6 to 1.5 at a wavelength of 400 nm. The capping layer containing a compound having an absorbance of 0.2 or more at wavelengths of 400 nm and 410 nm has a good function of absorbing light at wavelengths of 400 nm and 410 nm. Therefore, the organic EL element provided with the capping layer containing the compound having the absorbance of 0.2 or more has good light resistance and a long life.

Absorbance of the compounds represented by formulae (A-1) and (A-2) in this embodiment were measured using an ultraviolet-visible near-infrared spectrophotometer (V-650 manufactured by JASCO Co., Ltd.) using a toluene solvent at a concentration of $10^{-5}$ mol/L.

The compounds represented by formulae (A-1) and (A-2) preferably have an absorption coefficient in the range of 80,000 to 200,000. When the absorption coefficient of the compound is in the above range, a thin film having a good light absorbing function can be formed, and therefore, it is preferable as a material for the capping layer.

The absorption coefficients of the compounds represented by formulae (A-1) and (A-2) in this embodiment are calculated by preparing samples in toluene solution adjusted to four concentrations of $5.0\times10^{-6}$ mol/L, $1.0\times10^{-5}$ mol/L, $1.5\times10^{-5}$ mol/L, and $2.0\times10^{-5}$ mol/L, measuring the absorbance at the peak wavelength of each sample using an ultraviolet-visible near-infrared spectrophotometer (V-650 manufactured by JASCO Co., Ltd.), and preparing a calibration curve using the results.

"Method for Producing Compound Represented By General Formulae (A-1) and (A-2)"

The amine compound having a benzazole ring structure represented by formulae (A-1) and (A-2) can be produced, for example, by the following method.

First, a halogenated benzoazole derivative used as a raw material is produced in order to form a benzazole ring structure represented by formula (B-1) or (B-8) which is the main skeleton of compound represented by formula (A-1) and formula (A-2). The halogenated benzoazole derivative having a structure corresponding to a benzazole ring structure represented by formula (B-1) or (B-8) can be synthesized by a known method itself, for example, as follows (For example, see Non-Patent Document 4.).

Further, the synthesized halogenated benzoazole derivative and the arylamine are subjected to a coupling reaction by using a copper catalyst, a palladium catalyst or the like. Thus, the amine compound having the benzazole ring structure represented by the formula (A-1) or (A-2) can be synthesized.

An amine compound having a benzazole ring structure represented by the general formula (A-1) or (A-2) of the present disclosure can be synthesized similarly by carrying out a coupling reaction with a halogenated arylamine by using a boronic acid derivative or a boronic ester derivative instead of the halogenated benzoazole derivative (For example, see Non-Patent Documents 5 and 6.).

[Chemical Formula 16]

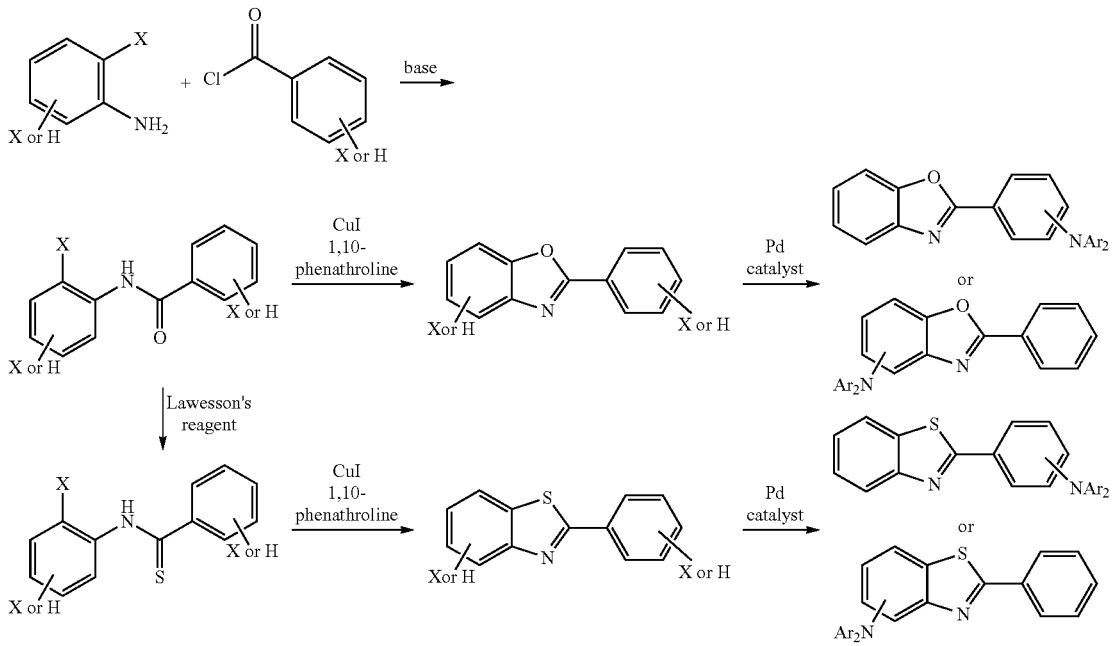

The compounds represented by formulae (A-1) and (A-2) thus synthesized are preferably used after purification by column chromatography; adsorption purification by silica gel, activated carbon, activated clay or the like; recrystallization or crystallization with a solvent; or sublimation purification.

The synthesized compounds represented by formulae (A-1) and (A-2) can be identified by NMR analysis.

"Anode"

In the organic EL element of the present embodiment, an anode is provided on a glass substrate. As the material of the anode, an electrode material having a large work function, such as ITO (indium tin oxide) or gold, is used.

As a method of producing the anode, a known method such as a vapor deposition method can be used.

"Organic Layer"

In the present embodiment, an example will be described in which the organic layer includes a hole injection layer, a hole transport layer, an electron blocking layer, a luminous layer, a hole blocking layer, an electron transport layer, and an electron injection layer, all of which are stacked in this order from the anode side.

(Hole Injection Layer)

As the material of the hole injection layer of the organic EL element of the present disclosure, an arylamine compound having three or more triphenylamine structures in a molecule and having a structure in which the three or more triphenylamine structures are linked by a single bond or a divalent group not containing a heteroatom, for example, a material such as a starburst type triphenylamine derivative, and various triphenylamine tetramers; a porphyrin compound represented by copper phthalocyanine; an acceptor type heterocyclic compound such as hexacyanoazatriphenylene; or a coating type polymer material can be used.

As the hole injection layer, a single layer formed of these materials alone may be used, or a single layer formed by mixing two or more materials may be used. The hole injection layer may be formed by laminating layers formed of the above materials alone, by laminating layers formed by mixing the materials, or by laminating the layers formed by mixing the materials with the layers formed of the above materials alone.

These materials may be formed into a thin film by a vapor deposition method, or may be formed into a thin film by a known method such as a spin coating method or an ink jet method in addition to a vapor deposition method.

(Hole Transport Layer)

As the material of the hole transport layer of the organic EL element of the present disclosure, it is preferable to use a benzidine derivative such as N, N'-diphenyl-N, N'-di(m-tolyl)benzidine (hereinafter referred to as TPD), N, N'-diphenyl-N, N'-di (α-naphthyl)benzidine (hereinafter referred to as NPD), N, N, N', N'-tetrabiphenylylbenzidine; 1,1-bis[4-(di-4-tolylamino)phenyl]cyclohexane (hereinafter referred to as TAPC); or the like. As the material of the hole transport layer, an arylamine compound having two triphenylamine structures in a molecule and having a structure in which the two triphenylamine structures are linked by a single bond or a divalent group not containing a hetero atom, for example, N, N, N', N'-tetrabiphenylylbenzidine is preferably used. Further, as the material of the hole transport layer, an arylamine compound having three or more triphenylamine structures in a molecule and having a structure in which the three or more triphenylamine structures are linked by a single bond or a divalent group not containing a hetero atom, for example, various triphenylamine trimers and tetramers are preferably used.

As the hole transport layer, a single layer formed of these materials alone or a single layer formed by mixing two or more materials may be used. The hole transport layer may be formed by laminating layers formed of the above materials alone, by laminating layers formed by mixing the materials, or by laminating the layers formed by mixing the materials with the layers formed of the above materials alone.

These materials may be formed into a thin film by a vapor deposition method, or may be formed into a thin film by a known method such as a spin coating method or an ink jet method in addition to a vapor deposition method.

As the material of the hole injection layer and the hole transport layer, a coating type polymer material such as poly(3,4-ethylenedioxythiophene) (hereinafter referred to as PEDOT)/poly (styrene sulfonate) (hereinafter referred to as PSS) may be used.

In the hole injection layer or the hole transport layer, a material which is obtained by further P-doping tris bromophenylamine hexachloroantimony or a radialene derivative in generally used material of this layer (for example, see Patent Document 3.) or a polymer compound having a structure of a benzidine derivative such as TPD in its partial structure, may be used.

(Electron Blocking Layer)

As the material of the electron blocking layer of the organic EL element of the present disclosure, a compound having an electron blocking function such as a carbazole derivative such as 4, 4', 4"-tri(N-carbazolyl)triphenylamine (hereinafter referred to as TCTA), 9,9-bis[4-(carbazole-9-yl)phenyl]fluorene, 1,3-bis(carbazole-9-yl)benzene (hereinafter referred to as mCP), 2, 2-bis(4-carbazole-9-ylphenyl) adamantane (hereinafter referred to as Ad-Cz); and a compound having a triarylamine structure and a triphenylsilyl group represented by 9-[4-(carbazole-9-yl)phenyl]-9-[4-(triphenylsilyl)phenyl]-9H-fluorene can be used.

As the electron blocking layer, a single layer formed of these materials alone or a single layer formed by mixing two or more materials may be used. The electron blocking layer may be formed by laminating layers formed of the materials alone, by laminating layers formed by mixing the materials, or by laminating layers formed by mixing the materials with the layers formed of these materials alone.

These materials may be formed into a thin film by a vapor deposition method, or may be formed into a thin film by a known method such as a spin coating method or an ink jet method in addition to a vapor deposition method.

(Luminous layer)

As the material of the luminous layer of the organic EL element, in addition to metal complexes of quinolinol derivatives such as $Alq_3$, various metal complexes, anthracene derivatives, bisstyrylbenzene derivatives, pyrene derivatives, oxazole derivatives, polyparaphenylenevinylene derivatives and the like can be used.

The luminous layer may be composed of a host material and a dopant material. An anthracene derivative is preferably used as the host material. As the host material, in addition to the luminous material, a heterocyclic compound having an indole ring as a partial structure of a condensed ring, a heterocyclic compound having a carbazole ring as a partial structure of a condensed ring, a carbazole derivative, a thiazole derivative, a benzimidazole derivative, a polydialkylfluorene derivative or the like can be used. As the dopant material, quinacridone, coumarin, rubrene, perylene and their derivatives, benzopyran derivatives, rhodamine derivatives, aminostyryl derivatives or the like can be used.

As the luminous layer, a single layer formed of these materials alone or a single layer formed by mixing two or more materials may be used. The luminous layer may be formed by laminating layers formed of the materials alone, by laminating layers formed by mixing the materials, or by laminating the layers formed by mixing the materials with the layers formed of these materials alone.

It is also possible to use a phosphorescent emitter as the luminous material. As the phosphorescent emitter, a phosphorescent emitter of a metal complex such as iridium or platinum can be used. For example, green phosphorescent emitters such as $Ir(ppy)_3$; blue phosphorescent emitters such as bis (3,5-difluoro-2-(2-carboxypyridyl) iridium (III) (FIrpic), bis(2,4-difluorophenylpyridinate)-tetrakis(1-pyrazolyl) borate iridium (III) (FIr6); red phosphorescent emitters such as bis (2-benzo[b]thiophene-2-yl-pyridine) (acetylacetonate) iridium (III) (Btp$_2$Ir(acac)) and the like can be used As the host material at this time, as a hole injecting host material and electron transporting host material, a carbazole derivative such as 4, 4'-di(N-carbazolyl) biphenyl (hereinafter referred to as CBP), TCTA or mCP can be used as the host material for hole injection/transport. As the electron transporting host material, p-bis(triphenylsilyl) benzene (hereinafter referred to as UGH2), 2, 2', 2''-(1, 3, 5-phenylene)-tris(1-phenyl-1H-benzimidazole) (hereinafter referred to as TPBI) or the like can be used, and a high-performance organic EL element can be manufactured.

Doping the phosphorescent emitting material into the host material is preferably performed by co-deposition in the range of 1 to 30% by mass with respect to the entire luminous layer to avoid concentration quenching.

As the luminous material, it is also possible to use a material that emits delayed fluorescence, such as 2-biphenyl-4, 6-bis(12-phenylindolo[2, 3-a]carbazole-11-yl)-1, 3, 5-triazine (PIC-TRZ), 2, 4-bis(f3-(9H-carbazole-9-yl)-6phenyl-1, 3, 5-triazine (CC2TA), 2, 4, 6-tri(4-(10H-phenoxazine-10H-yl)phenyl)-1, 3, 5-triazine (PXZ-TRZ), 2, 4, 5, 6-tetra(9H-carbazole-9-yl) isophthalonitrile (4CyIPN), carbazolyldicyanobenzene (CDCB) derivatives (for example, see Non-Patent Document 7).

These luminous materials may be formed into a thin film by a vapor deposition method, or may be formed into a thin film by a known method such as a spin coating method or an ink jet method in addition to the vapor deposition method.

(Hole Blocking Layer)

As the material of the hole blocking layer of the organic EL element, a compound having a hole blocking function, such as a phenanthroline derivative such as bathocuproine (hereinafter abbreviated as BCP), a metal complex of a quinolinol derivative such as aluminum (III) bis(2-methyl-8-quinolinato)-4-phenylphenolate (hereinafter, refer to as BAlq), various rare earth complexes, triazole derivatives, triazine derivatives, pyrimidine derivatives, oxadiazole derivatives, and benzazole derivatives can be used. These materials may also serve as materials for the electron transport layer.

As the hole blocking layer, a single layer formed of these materials alone or a single layer formed by mixing two or more materials may be used. The hole blocking layer may be formed by laminating layers formed of the above materials alone, by laminating layers formed by mixing the materials, or by laminating the layers formed by mixing the materials with the layers formed of these materials alone.

These materials may be formed into a thin film by a vapor deposition method, or may be formed into a thin film by a known method such as a spin coating method or an ink jet method in addition to a vapor deposition method.

(Electron Transport Layer)

As the material of the electron transport layer of the organic EL element, in addition to metal complexes of quinolinol derivatives such as Alp$_3$ and BAlp, various metal complexes, triazole derivatives, triazine derivatives, pyrimidine derivatives, oxadiazole derivatives, pyridine derivatives, benzimidazole derivatives, benzazole derivatives, thiadiazole derivatives, anthracene derivatives, carbodiimide derivatives, quinoxaline derivatives, pyridoindole derivatives, phenanthroline derivatives, silole derivatives, or the like can be used.

The electron transport layer may be a single layer formed of these materials or a single layer formed by mixing two or more materials. The electron transport layer may be formed by laminating layers formed of the materials alone, by laminating layers formed by mixing the materials, or by laminating the layers formed by mixing the materials with the layers formed of these materials alone.

These materials may be formed into a thin film by a vapor deposition method, or may be formed into a thin film by a known method such as a spin coating method or an ink jet method in addition to a vapor deposition method.

(Electron Injection Layer)

As the material of the electron injection layer of the organic EL element of the present disclosure, an alkali metal salt such as lithium fluoride and cesium fluoride; an alkaline earth metal salt such as magnesium fluoride; a metal complex of a quinolinol derivative such as lithium quinolinol; a metal oxide such as aluminum oxide; a metal such as ytterbium (Yb), samarium (Sm), calcium (Ca), strontium (Sr), cesium (Cs); or the like can be used.

The electron injection layer may be omitted in the preferred choice of electron transport layer and cathode.

Further, in the electron injection layer or the electron transport layer, a material in which a metal such as cesium is further N-doped to a material usually used for the layer can be used.

As a method of producing the electron injection layer, a known method such as a vapor deposition method can be used.

"Cathode"

As the material of the cathode of the organic EL element of the present disclosure, an electrode material having a low work function such as aluminum; an alloy having a lower work function such as a magnesium-silver alloy, a magnesium-calcium alloy, a magnesium-indium alloy, and an aluminum-magnesium alloy; a transparent electrode material such as ITO and a material (IZO) composed of indium oxide and zinc oxide; or the like can be used.

In the organic EL element of the present embodiment, the first electrode arranged in contact with the capping layer is a cathode. Therefore, the cathode is preferably transparent or semitransparent in order to form an organic EL element having high light extraction efficiency.

As a method of producing the cathode, a known method such as a vapor deposition method can be used.

The organic EL element of the present embodiment has a capping layer which has a refractive index higher than that of the semitransparent electrode and is provided outside the transparent or semitransparent electrode. Thus, in the organic EL element of this embodiment, the light extraction efficiency can be greatly improved. The film can be formed at <400° C. by using an amine compound having a benzazole ring compound represented by formula (A-1) or (A-2) in the capping layer. Therefore, the capping layer in which the light extraction efficiency of each color is optimized can be formed using the high-definition mask without damaging the light emitting element. Therefore, the organic EL element of this embodiment can be suitably applied to a full-color display, and can display a clear and bright image with good color purity.

The organic EL element of the present embodiment uses, as the material of the capping layer, a material for the organic EL element having a high absorption coefficient, a high refractive index, and excellent thin-film stability, durability, and light resistance. For this reason, the organic EL element of the present embodiment is not affected by sunlight and maintains color purity compared with the conventional organic EL element, enabling a significant improvement in light extraction efficiency. Further, according to the organic EL element of the present embodiment, it is possible to realize an organic EL element having high efficiency and a long life.

Although an organic EL element having a top emission structure has been described above, the present disclosure is not limited thereto. The present disclosure can be similarly applied to an organic EL element having a bottom emission structure and an organic EL element having a dual emission structure emitting light from both the top and bottom. In these cases, the electrode in the direction in which the light is extracted from the light emitting element is preferably transparent or semitransparent.

"Method of Producing Organic EL Element"

The method of producing an organic EL element of the present embodiment includes a step of forming an organic layer including a luminous layer between a first electrode and a second electrode, and a step of laminating a capping layer on the opposite surface of the first electrode with respect to the organic layer.

In this embodiment, the capping layer is formed by using a tertiary amine compound represented by general formula (A-1) or (A-2) having a benzazole ring structure. As a method for laminating the capping layer, a vapor deposition method is preferably used because the vapor deposition method is a suitable method for mass-producing thin films of nano units.

EXAMPLE

Hereinafter, embodiments of the present invention will be described in detail with reference to examples. The present invention is not limited to the following examples without departing from the scope thereof.

Example 1

Synthesis of Compound Represented by Formula (10)<Bis-{4-(benzoxazole-2-yl)phenyl}-([1, 1', 2', 1" ]terphenyl-4'-yl)-amine>

To the reaction vessel, 5.6 g of ([1, 1', 2',1" ]terphenyl-4'-yl)-amine, 14.4 g of 2-(4-bromophenyl)benzoxazole, 4.4 g of sodium t-butoxy, and 60 ml of toluene were added, and nitrogen gas was vented under ultrasonic irradiation for 30 minutes. To the reaction vessel, 0.1 g of palladium acetate and 0.4 ml of a 50% (w/v) toluene solution of tri-(tert-butyl)phosphine was further added, and the mixture was stirred under heating at reflux overnight. After the reaction vessel was allowed to cool, methanol was added to collect the precipitated solid to obtain a crude product. A solid precipitated by crystallization and purification with a toluene/acetone mixed solvent was collected from the crude material, and a yellow powder of bis-{4-(benzoxazole-2-yl)phenyl}-([1,1',2',1" ]terphenyl-4'-yl)-amine (the compound represented by the above formula (10)): 11.0 g (Yield of 76.4%) was obtained.

The structure of the obtained yellow powder was identified using NMR.

The following 29 hydrogen signals were detected by 1H-NMR (DMSO-$d_6$).

δ(ppm)=8.19 (4H), 7.78 (4H), 7.50 (1H), 7.45-7.34 (8H), 7.30 (1H), 7.28-7.18 (7H), 7.15 (2H).

Example 2

Synthesis of Compound Represented by Formula (16)<Bis-{4-(benzoxazole-2-yl)phenyl}-(9,9-dimethyl-9H-fluorene-2-yl)-amine>

To the reaction vessel, 3.0 g of 9, 9-dimethyl-9H-fluorene-2-yl-amine, 8.6 g of 2-(4-bromophenyl)benzoxazole, 4.1 g of sodium t-butoxy and 60 ml of toluene were added, and nitrogen gas was vented under irradiation of ultrasonic waves for 30 minutes. To the reaction vessel, 0.1 g of tris(dibenzylideneacetone) palladium (0) and 0.6 ml of a 50% (w/v) toluene solution of tri-(tert-butyl)phosphine was further added, and the mixture was stirred under heating at reflux overnight. After the reaction vessel was allowed to cool, toluene was added to the reaction vessel to perform dispersion washing, the insoluble matter was filtered, and the filtrate was concentrated to obtain a crude product. A solid precipitated by crystallization and purification with a toluene/acetone mixed solvent was collected from the crude material, and a yellow powder of Bis-{4-(benzoxazole-2-yl)phenyl}-(9,9-dimethyl-9H-fluorene-2-yl)-amine (the compound represented by the above formula (16)): 7.4 g (Yield of 86.7%) was obtained.

The structure of the obtained yellow powder was identified using NMR.

The following 29 hydrogen signals were detected by 1H-NMR (DMSO-$d_6$).

δ(ppm)=8.16 (4H), 7.90 (1H), 7.83 (1H), 7.77 (4H), 7.55 (1H), 7.47 (1H), 7.40 (4H), 7.35 (2H), 7.29 (4H), 7.20 (1H), 1.43 (6H).

Example 3

Synthesis of Compound Represented by Formula (17)<Bis-{4-(benzoxazole-2-yl)phenyl}-(9,9-diphenyl-9H-fluorene-2-yl)-amine>

To the reaction vessel, 5.0 g of 9, 9-diphenyl-9H-fluorene-2-yl-amine, 9.0 g of 2-(4-bromophenyl)benzoxazole, 4.3 g of sodium t-butoxy and 60 ml of toluene were added, and nitrogen gas was vented while irradiating with ultrasonic waves for 30 minutes. To the reaction vessel, 0.3 g of tris(dibenzylideneacetone) palladium (0) and 0.6 ml of a 50% (w/v) toluene solution of tri-(tert-butyl)phosphine was further added, and the mixture was stirred under heating at reflux overnight. After the reaction vessel was allowed to cool, toluene was added to perform dispersion washing, the insoluble matter was filtered, and the filtrate was concentrated to obtain a crude product. A solid precipitated by crystallization and purification with a toluene/acetone mixed solvent was collected from the crude material, and a yellow powder of bis-{4-(benzoxazole-2-yl)phenyl}-(9,9-diphenyl-9H-fluorene-2-yl)-amine (the compound represented by the above formula (17)): 8.4 g (Yield of 77.8%) was obtained.

The structure of the obtained yellow powder was identified using NMR.

The following 33 hydrogen signals were detected by 1H-NMR (DMSO-$d_6$).

δ(ppm)=8.13 (4H), 8.01 (1H), 7.94 (1H), 7.78 (4H), 7.48-7.21 (19H), 7.10 (4H).

Example 4

Synthesis of Compound Represented by Formula (12)<Bis-{4-(benzoxazole-2-yl)phenyl}-{4-(naphthalene-1-yl)phenyl}amine>

To the reaction vessel, 7.5 g of 4-(naphthalene-1-yl)phenyl-amine, 20.6 g of 2-(4-bromophenyl)benzoxazole, 9.9 g of sodium t-butoxy, and 150 ml of toluene were added, and nitrogen gas was vented under irradiation of ultrasonic waves for 30 minutes. To the reaction vessel, 0.9 g of tris(dibenzylideneacetone) dipalladium (0) and 0.4 ml of 50% (w/v) toluene solution of tri-(tert-butyl)phosphine was further added, and the mixture was stirred under heating at reflux for 3 hours. After the reaction vessel was allowed to cool down to 80° C., the insoluble matter was filtered and the filtrate was concentrated to obtain a crude product. The crude was purified by column chromatography to afford a yellow powder of bis-{4-(benzoxazole-2-yl)phenyl}-{4-(naphthalene-1-yl)phenyl}amine (the compound represented by the above formula (12)): 3.4 g (Yield of 16%).

The structure of the obtained yellow powder was identified using NMR.

The following 27 hydrogen signals were detected by 1H-NMR (CDCl$_3$).

δ(ppm)=8.26-8.22 (4H), 8.02-8.09 (1H), 7.89-7.97 (2H), 7.77-7.83 (2H), 7.49-7.63 (8H), 7.32-7.42 (10H).

Example 5

Synthesis of Compound Represented by Formula (76)<Bis-{4-(benzoxazole-2-yl)phenyl}-{4-(naphthalene-2-yl)phenyl}amine>

To the reaction vessel, 7.5 g of 4-(naphthalene-2-yl)phenyl-amine, 20.6 g of 2-(4-bromophenyl)benzoxazole, 9.9 g of sodium t-butoxy, and 150 ml of toluene were added, and nitrogen gas was vented under irradiation of ultrasonic waves for 30 minutes. To the reaction vessel, 0.9 g of tris(dibenzylideneacetone) dipalladium (0) and 0.4 ml of a 50% (w/v) toluene solution of tri-(tert-butyl)phosphine was further added, and the mixture was stirred under heating at reflux for 3 hours. The reaction vessel was allowed to cool down to 80° C., silica gel was added thereto, and the mixture was filtered, and the filtrate was concentrated to obtain a crude product. The crude was recrystallized with toluene to give a yellow powder of bis-{4-(benzoxazole-2-yl)phenyl}-{4-(naphthalene-2-yl)phenyl}amine (the compound represented by the above formula (76)): 6.3 g (Yield of 30%).

The structure of the obtained yellow powder was identified using NMR.

The following 27 hydrogen signals were detected by 1H-NMR (CDCl$_3$).

δ(ppm)=8.19-8.24 (4H), 8.09 (1H), 7.87-7.97 (3H), 7.73-7.83 (5H), 7.51-7.62 (4H), 7.32-7.42 (10H).

Example 6

Synthesis of Compound Represented by Formula (77)<Bis-{4-(benzoxazole-2-yl)phenyl}-{4-(phenanthrene-9-yl)phenyl}amine>

To the reaction vessel, 8.0 g of 4-(phenanthrene-9-yl)phenyl-amine, 17.9 g of 2-(4-bromophenyl)benzoxazole, 8.6 g of sodium t-butoxy, and 160 ml of toluene was added, and nitrogen gas was vented under irradiation of ultrasonic waves for 30 minutes. To the reaction vessel, 0.8 g of tris(dibenzylideneacetone) dipalladium (0) and 0.4 ml of a 50% (w/v) toluene solution of tri-(tert-butyl)phosphine was further added, and the mixture was stirred under heating at reflux for 3 hours. The reaction vessel was allowed to cool down to 80° C., silica gel was added thereto, and the mixture was filtered, and the filtrate was concentrated to obtain a crude product. The crude was recrystallized with toluene to give a yellow powder of bis-{4-(benzoxazole-2-yl)phenyl}-{4-(phenanthrene-9-yl)phenyl}amine (the compound represented by the above formula (77)): 15.0 g (Yield of 77.0%).

The structure of the obtained yellow powder was identified using NMR.

The following 29 hydrogen signals were detected by 1H-NMR (CDCl$_3$).

δ(ppm)=8.73-8.84 (2H), 8.24-8.27 (4H), 8.07-11 (1H), 7.92-7.97 (1H), 7.57-7.84 (11H), 7.35-7.43 (10H).

Example 7

Synthesis of Compound Represented by Formula (78)<Bis-{3-(benzoxazole-2-yl)phenyl}-{4-(naphthalene-1-yl)phenyl}amine>

To the reaction vessel, 7.5 g of 4-(naphthalene-1-yl)phenyl-amine, 20.6 g of 2-(3-bromophenyl)benzoxazole, 9.9 g of sodium t-butoxy, and 150 ml of toluene was added, and nitrogen gas was vented under irradiation of ultrasonic waves for 30 minutes. To the reaction vessel, 0.9 g of tris(dibenzylideneacetone) dipalladium (0) and 0.4 ml of a 50% (w/v) toluene solution of tri-(tert-butyl)phosphine was further added, and the mixture was stirred under heating at reflux for 3 hours. After the reaction vessel was allowed to cool down to 80° C., the insoluble matter was filtered and the filtrate was concentrated to obtain a crude product. The crude was purified by column chromatography to afford a yellow powder of bis-{3-(benzoxazole-2-yl)phenyl}-{4-(naphthalene-1-yl)phenyl}amine (the compound represented by the above formula (78)): 7.6 g (Yield of 46%).

The structure of the obtained yellow powder was identified using NMR.

The following 27 hydrogen signals were detected by 1H-NMR (CDCl$_3$).

δ(ppm)=8.18-8.20 (2H), 8.08-8.14 (1H), 8.01-8.05 (2H), 7.86-7.95 (2H), 7.74-7.82 (2H), 7.31-7.62 (18H).

Example 8

Synthesis of Compound Represented by Formula (79)<Bis-{3-(benzoxazole-2-yl)phenyl}-{4-(naphthalene-2-yl)phenyl}amine>

To the reaction vessel, 6.0 g of 4-(naphthalene-2-yl)phenyl-amine, 15.8 g of 2-(3-bromophenyl)benzoxazole, 7.9 g of sodium t-butoxy, and 120 ml of toluene was added, and nitrogen gas was vented under irradiation of ultrasonic waves for 30 minutes. To the reaction vessel, 0.8 g of tris(dibenzylideneacetone) dipalladium (0) and 0.4 ml of a 50% (w/v) toluene solution of tri-(tert-butyl)phosphine was further added, and the mixture was stirred under heating at reflux for 3 hours. After the reaction vessel was allowed to cool down to 80° C., silica gel was added thereto and filtered, and the filtrate was concentrated to obtain a crude product. The crude was recrystallized with toluene to give a yellow powder of bis-{3-(benzoxazole-2-yl)phenyl}-{4-(naphthalene-2-yl)phenyl}amine (the compound represented by the above formula (79)): 12.4 g (Yield of 75%).

The structure of the obtained yellow powder was identified using NMR.

The following 27 hydrogen signals were detected by 1H-NMR (CDCl$_3$).

δ(ppm)=8.14-8.15 (2H), 8.08 (1H), 7.99-8.04 (2H), 7.86-7.96 (3H), 7.69-7.82 (5H), 7.46-7.60 (6H), 7.30-7.42 (8H).

Example 9

Synthesis of (80)<Bis-{3-(benzoxazole-2-yl)phenyl}-{4-(phenanthrene-9-yl)phenyl}amine>

To the reaction vessel, 7.0 g of 4-(phenanthrene-9-yl)phenyl-amine, 15.7 g of 2-(3-bromophenyl)benzoxazole, 7.5 g of sodium t-butoxy, and 160 ml of toluene was added, and nitrogen gas was vented under irradiation of ultrasonic waves for 30 minutes. To the reaction vessel, 0.7 g of tris(dibenzylideneacetone) dipalladium (0) and 0.3 ml of a 50% (w/v) toluene solution of tri-(tert-butyl)phosphine was further added, and the mixture was stirred under heating at reflux for 3 hours. After the reaction vessel was allowed to cool down to 80° C., silica gel was added thereto and filtered, and the filtrate was concentrated to obtain a crude product. The crude product was recrystallized with toluene to give a yellow powder of bis-{3-(benzoxazole-2-yl)phenyl}-{4-(phenanthrene-9-yl)phenyl}amine (the compound represented by the above formula (80)): 9.2 g (Yield of 54%).

The structure of the obtained yellow powder was identified using NMR.

The following 29 hydrogen signals were detected by 1H-NMR (CDCl$_3$).

δ(ppm)=8.72-8.84 (2H), 8.12-8.22 (3H), 8.02-8.07 (2H), 7.92-7.97 (1H), 7.34-7.84 (21H).

Example 10

Synthesis of Compound Represented by Formula (60)<Bis-{4-(benzothiazole-2-yl)-phenyl}-([1,1',2',1" ]terphenyl-4'-yl)-amine>

To the reaction vessel, 6.2 g of ([1, 1',2',1" ]terphenyl-4'-yl)-amine, 16.1 g of 2-(4-bromophenyl) benzothiazole, 7.3 g of sodium t-butoxy and 160 ml of toluene was added, and nitrogen gas was vented under irradiation of ultrasonic waves for 30 minutes. To the reaction vessel, 0.2 g of palladium acetate and 0.6 ml of a 50% (w/v) toluene solution of tri-(tert-butyl)phosphine was further added, and the mixture was stirred under heating at reflux overnight. After the reaction vessel was allowed to cool down to 80° C., silica gel was added thereto and filtered, and the filtrate was concentrated to obtain a crude product. The crude was recrystallized with toluene to give a yellow powder of bis-{4-(benzothiazole-2-yl)-phenyl}-([1, 1',2',1" ]terphenyl-4'-yl)-amine (the compound represented by the above formula (60)): 9.7 g (Yield of 58%).

The structure of the obtained yellow powder was identified using NMR.

The following 29 hydrogen signals were detected by 1H-NMR (CDCl$_3$).

δ(ppm)=8.18-8.20 (4H), 7.50-7.76 (4H), 7.19-7.42 (19H), 7.06-7.16 (2H).

Example 11

Synthesis of a compound represented by the above formula (85)<Bis-(2, 4-Diphenyl-benzoxazole-6-yl)-phenyl-amine>

The reaction vessel, 0.5 g of aniline, 3.5 g of 2,4-diphenyl-6-chloro-benzoxazole, 1.6 g of sodium t-butoxy, and 20 ml of xylene was added, and nitrogen gas was vented under ultrasonic irradiation for 30 minutes. To the reaction vessel, 0.1 g of tris(dibenzylideneacetone) dipalladium (0) and 0.2 g of tri-cyclohexylphosphine was further added, and the mixture was stirred under heated reflux overnight. After the reaction vessel was allowed to cool, the filtrate was concentrated by filtration to obtain a crude product. The crude was purified by column chromatography to obtain a yellow powder of bis-(2, 4-Diphenyl-benzoxazole-6-yl)-phenyl-amine (the compound represented by the above formula (85)): 2.0 g (Yield of 59%).

The structure of the obtained yellow powder was identified using NMR.

The following 29 hydrogen signals were detected by 1H-NMR (DMSO-d$_6$).

δ(ppm)=8.19 (2H), 8.17 (2H), 7.96 (4H), 7.63 (4H), 7.61 (2H), 7.55-7.46 (6H), 7.45-7.35 (6H), 7.25 (3H).

(Determination of Melting Point and Glass Transition Temperature (Tg) of Compounds)

A melting point and a glass transition point (Tg) of each powder of the compound represented by the formulae (10), (12), (16), (17), (76), and (77) synthesized in Examples 1 to 6 were measured using a high-sensitivity differential scanning calorimeter (DSC 3100 SA, manufactured by Bulker AXS). The results are shown below.

Example 1 (the compound of formula (10)) melting point: not observed, Tg: 120° C.

Example 2 (the compound of formula (16)) melting point: not observed, Tg: 121° C.

Example 3 (the compound of formula (17)) melting point: 267° C., Tg: 147° C.

Example 4 (the compound of formula (12)) melting point: 226° C., Tg: 114° C.

Example 5 (the compound of formula (76)) melting point: 249° C., Tg: 111° C.

Example 6 (the compound of formula (77)) melting point: not observed, Tg: 133° C.

Example 7 (the compound of formula (78)) melting point: 210° C., Tg: 101° C.

Example 8 (the compound of formula (79)) melting point: 256° C., Tg: 102° C.

Example 9 (the compound of formula (80)) melting point: not observed, Tg: 120° C.

Example 10 (the compound of formula (60)) melting point: not observed, Tg: 121° C.

Example 11 (the compound of formula (85)) melting point: 240° C., Tg: 113° C.

Further, from the above measurement results, it was found that each of the compounds represented by the formulae (10), (12), (16), (17), (60), (76), (77), (78), (79), (80), and (85) has a glass transition point (Tg) of 100° C. or higher and is a material which can form thin films with good stability.

(Determination of Peak Wavelength, Absorbance and Extinction Coefficient of Compound)

The compounds represented by the formulae (10), (12), (16), (17), (60), (76), (77), (78), (79), (80), and (85) synthesized in Examples 1 to 11 were adjusted in toluene to a concentration of $10^{-5}$ mol/L, respectively, and the absorbance was measured in the wavelength range of 200 to 600 nm using an ultraviolet-visible near-infrared spectrophotometer (V-650 manufactured by JASCO Co., Ltd.) to determine the peak wavelength. The results are shown in Table 1.

Further, with respect to the compound represented by the formula (10), (12), (16), (17), (60), (76), (77), (78), (79), (80), and (85) synthesized in Examples 1 to 11, the concentration was adjusted to $10^{-5}$ mol/in toluene solvent, respectively, and the absorbance at 400 nm and 410 nm was measured using an ultraviolet-visible near-infrared spectrophotometer (V-650 manufactured by JASCO Co., Ltd.). The results are shown in Table 1.

In addition, with respect to the compounds represented by the formulae (10), (12), (16), (17), (60), (76), (77), (78), (79), (80), and (85) synthesized in Examples 1 to 11, samples were prepared by adjusting the concentrations in toluene solution to four kinds, i.e., $5.0 \times 10^{-6}$ mol/L, $1.0 \times 10^{-5}$ mol/L, $1.5 \times 10^{-5}$ mol/L, and $2.0 \times 10^{-5}$ mol/L, respectively. The absorbance at the peak wavelength of each sample was measured using an ultraviolet-visible near-infrared spectrophotometer (V-650 manufactured by JASCO Co., Ltd.), and a calibration curve was prepared for each compound to calculate the absorption coefficient. The results are shown in Table 1.

For comparison, the peak wavelengths, absorbances and absorption coefficients of the compounds represented by the formula (2-1) and Alq$_3$ were measured in the same manner as those of the compounds represented by the formula (10).

The results are summarized in Table 1.

[Chemical Formula 17]

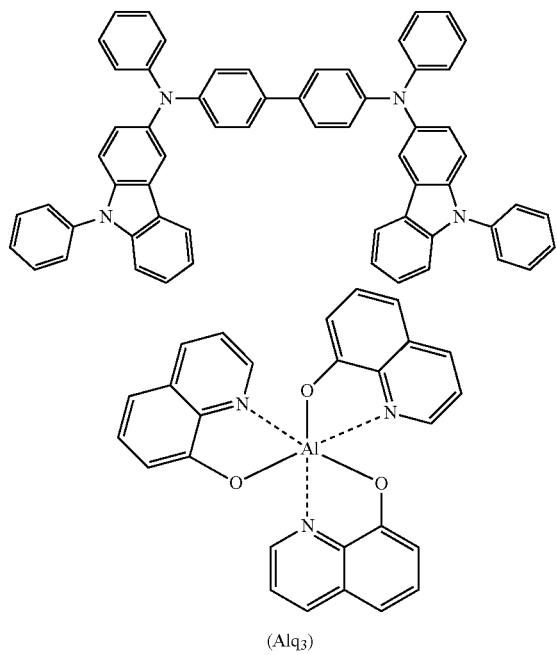

(2-1)

(Alq$_3$)

TABLE 1

|  | Peak wavelength (λmax) | Absorbance (λ: 400 nm) | Absorbance (λ: 410 nm) | Absorption coefficient |
|---|---|---|---|---|
| Compound 10 | 387 nm | 0.94 | 0.29 | 130367 |
| Compound 16 | 371 nm | 0.81 | 0.24 | 112505 |
| Compound 17 | 374 nm | 0.87 | 0.25 | 112987 |
| Compound 12 | 384 nm | 0.91 | 0.27 | 120833 |
| Compound 76 | 371 nm | 1.07 | 0.31 | 142000 |
| Compound 77 | 383 nm | 0.98 | 0.29 | 134285 |
| Compound 78 | 345 nm | 0.6 | 0.21 | 100841 |
| Compound 79 | 345 nm | 0.70 | 0.21 | 101884 |
| Compound 80 | 349 nm | 0.77 | 0.20 | 107576 |
| Compound 60 | 387 nm | 1.20 | 0.41 | 182051 |
| Compound 85 | 348 nm | 0.70 | 0.20 | 102899 |
| Comparative compounds (2-1) | 358 nm | 0.07 | 0.02 | 48856 |
| Alq$_3$ | 394 nm | 0.07 | 0.06 | 7518 |

As shown in Table 1, each peak wavelength of the compounds represented by formula (10), (12), (16), (17), (60), (76), (77), (78), (79), (80), and (85) was close to 400 nm, which is the same as that of the compound represented by formula (2-1) and Alq$_3$. From this, it has been found that a compound represented by the formula (10), (12), (16), (17), (60), (76), (77), (78), (79), (80), and (85) can be used as a material for a thin film which hardly absorbs light in the blue, green and red wavelength regions and absorbs light at wavelengths of 400 nm and 410 nm, respectively.

As shown in Table 1, each compound represented by formula (10), (12), (16), (17), (60), (76), (77), (78), (79), (80), and (85) has a higher absorbance than the compound represented by formula (2-1) and Alq$_3$. From this, it was found that compound represented by formula (10) (12), (16), (17), (60), (76), (77), (78), (79), (80), and (85) is a material capable of forming a thin film having a good function of absorbing light at wavelengths of 400 nm and 410 nm as compared to the compound represented by formula (2-1) and Alq$_3$ at the same concentration.

Further, the compound represented by formula (10), (12), (16), (17), (60), (76), (77), (78), (79) and (80) (85) has a larger absorption coefficient than the compound represented by formula (2-1) and Alq$_3$. Therefore, by using a compound represented by the formulae (10), (12) (16), (17), (60), (76), (77), (78), (79), (80), and (85), a film having a significantly higher light absorbing function can be formed as the film thickness is increased.

(Measurement of Refractive Index and Extinction Coefficient of Thin Film)

A vapor deposition film having a film thickness of 80 nm was formed on a silicon substrate using the compounds represented by the formulae (10), (12), (16), (17), (60), (76), (77), (78), (79), (80), and (85) synthesized in Examples 1 to 11.

The refractive index n and the extinction coefficient k of the deposited films were measured with a spectrophotometer (Filmetrix, F10-RT-UV) when light having a wavelength of 400 nm was transmitted and when light having a wavelength of 410 nm was transmitted, respectively. The results are shown in Table 2.

For comparison, a vapor-deposited film having a film thickness of 80 nm was prepared on a silicon substrate using each of the compounds represented by formula (2-1) and Alq$_3$, and the refractive index n and the extinction coefficient k were measured when light having a wavelength of 400 nm and light having a wavelength of 410 nm were transmitted in the same manner as in the vapor-deposited film of the compounds represented by formula (10) (For example, see Patent Document 4.) The results are summarized in Table 2.

TABLE 2

|  | Refractive index n (λ: 400 nm) | Refractive index n (λ: 410 nm) | Extinction coefficient k (λ: 400 nm) | Extinction coefficient k (λ: 410 nm) |
|---|---|---|---|---|
| Compound 10 | 2.37 | 2.47 | 0.66 | 0.44 |
| Compound 6 | 2.31 | 2.37 | 0.67 | 0.49 |
| Compound 17 | 2.32 | 2.35 | 0.57 | 0.39 |
| Compound 12 | 2.43 | 2.56 | 0.74 | 0.50 |
| Compound 76 | 2.50 | 2.56 | 0.75 | 0.51 |
| Compound 77 | 2.49 | 2.60 | 0.72 | 0.48 |
| Compound 78 | 2.30 | 2.20 | 0.45 | 0.31 |
| Compound 79 | 2.35 | 2.29 | 0.57 | 0.35 |
| Compound 80 | 2.48 | 2.40 | 0.60 | 0.40 |
| Compound 60 | 2.23 | 2.47 | 0.85 | 0.67 |
| Compound 85 | 2.43 | 2.38 | 0.48 | 0.28 |
| Comparative compounds (2-1) | 2.13 | 2.10 | 0.15 | 0.06 |
| Alq$_3$ | 1.86 | 1.89 | 0.16 | 0.14 |

As shown in Table 2, each thin film made of compounds represented by formulae (10), (12) (16), (17), (60), (76), (77), (78), (79), (80), and (85) has a higher refractive index n when light having wavelengths of 400 nm and 410 nm is transmitted compared to a thin film made of the compound represented by formula (2-1) and a thin film made of Alq₃.

Therefore, by using a thin film made of a compound represented by the formula (10), (12), (16), (17), (60), (76), (77), (78), (79), (80), and (85) as a capping layer, the extraction efficiency of light in the organic EL element can be expected to be improved.

Each thin film made of compounds represented by formulae (10), (12), (16), (17), (60), (76), (77), (78), (79), (80), and (85) has a higher extinction coefficient k when light having wavelengths of 400 nm and 410 nm was transmitted compared with the thin films made of the compounds represented by formula (2-1) and Alq₃.

This indicates that each capping layer using the thin films of the compounds represented by formula (10) (12), (16) (17), (60), (76), (77), (78), (79), (80), and (85) absorbs light having a wavelength of 400 nm to 410 nm of sunlight well and does not affect the material inside the element.

Example 12

The organic EL element shown in FIG. 1 was manufactured by means of the following method.

A hole injection layer 3, a hole transport layer 4, a luminous layer 5, an electron transport layer 6, an electron injection layer 7, a cathode 8, and a capping layer 9 were formed in this order by a vapor deposition method on a glass substrate 1 on which a reflective electrode was previously formed as an anode 2 made of metal, thereby obtaining an organic EL element shown in FIG. 1.

Specifically, the glass substrate 1 was prepared by forming the anode 2 thereon, which was obtained by sequentially forming ITO with a film thickness of 50 nm, a reflection film of a silver alloy with a film thickness of 100 nm, and ITO with a film thickness of 5 nm. The glass substrate 1 was ultrasonically cleaned in isopropyl alcohol for 20 minutes and then dried on a hot plate heated to 250° C. for 10 minutes. After UV ozone treatment was performed for 2 minutes, the glass substrate 1 with ITO was mounted in a vacuum vapor deposition apparatus, and the pressure in the vacuum vapor deposition apparatus was reduced to 0.001 Pa or less.

Subsequently, as the hole injection layer 3 covering the anode 2, an electron acceptor (Acceptor-1) and a compound represented by the following formula (3-1) were subjected to binary vapor deposition at a vapor deposition rate at which the vapor deposition rate ratio was Acceptor-1:Compound (3-1)=3:97, so as to form a film thickness of 10 nm.

On the hole injection layer 3, as a hole transport layer 4, a compound (3-1) was formed to have a film thickness of 140 nm.

On the hole transporting layer 4, as the luminous layer 5, a compound represented by the following formula (3-2) and a compound represented by the following formula (3-3) were subjected to binary vapor deposition at a vapor deposition rate at which the vapor deposition rate ratio was Compound (3-2):Compound (3-3)=5:95, so as to form a film thickness of 20 nm.

On the luminous layer 5, as the electron transport layer 6, a compound represented by the following formula (3-4) and a compound represented by the following formula (3-5) were subjected to binary vapor deposition at a vapor deposition rate at which the vapor deposition rate ratio was Compound (3-4):Compound (3-5)=50:50, so as to form a film thickness of 30 nm.

[Chemical Formula 18]

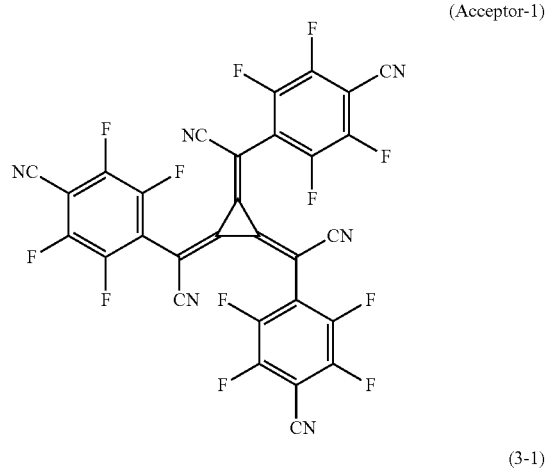

(Acceptor-1)

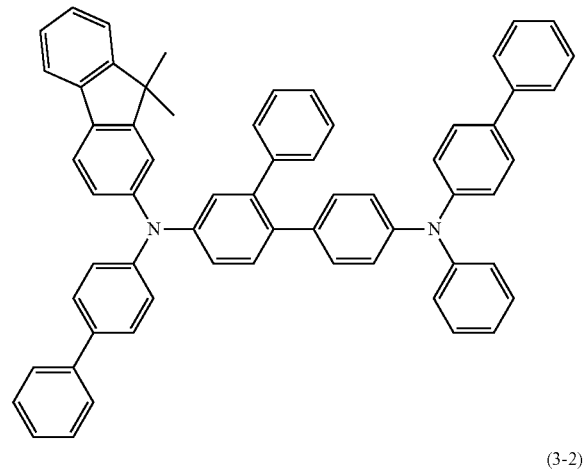

(3-1)

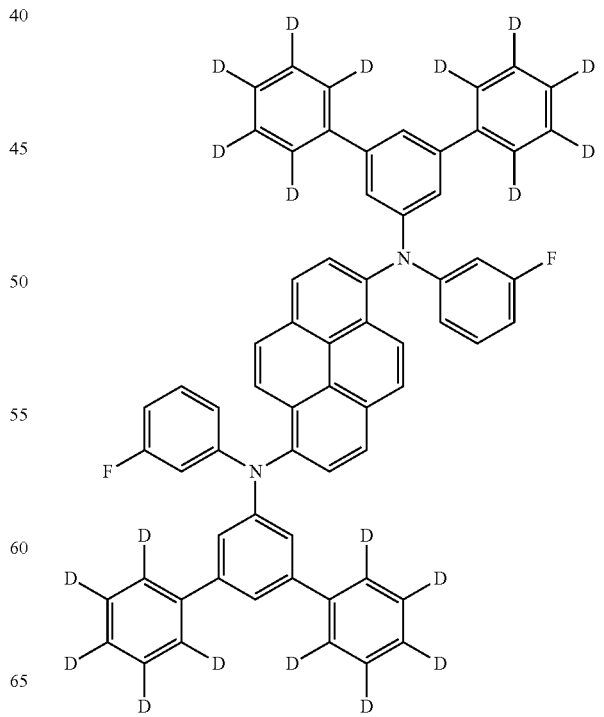

(3-2)

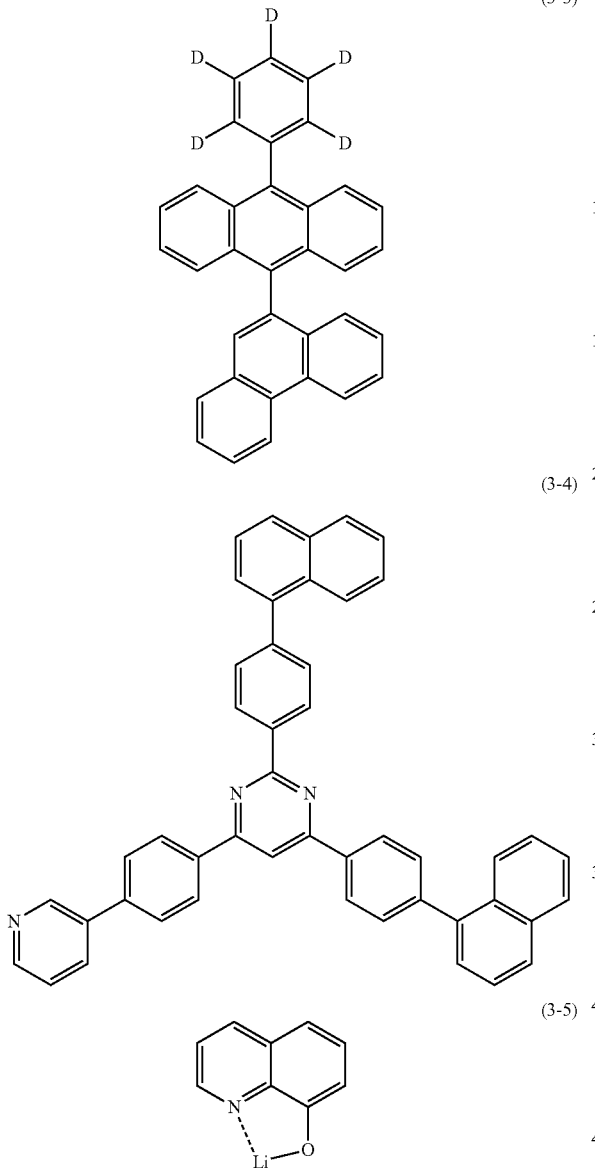

(3-3)

(3-4)

(3-5)

On the electron transport layer 6, as an electron injection layer 7, lithium fluoride was formed so as to have a film thickness of 1 nm.

On the electron injection layer 7, as a cathode 8, a magnesium silver alloy was formed so as to have a film thickness of 12 nm.

Finally, the compound represented by formula (10) synthesized in Example 1 was evaporated on the cathode 8 to form the capping layer 9 having a film thickness of 60 nm, thereby obtaining the organic EL element of Example 12.

Example 13

An organic EL element of Example 13 was obtained in the same manner as in Example 12, except that a compound of formula (16) synthesized in Example 2 was used as a material for the capping layer 9.

Example 14

The organic EL element of Example 14 was obtained in the same manner as in Example 12, except that the capping layer 9 was made of a compound of formula (17) synthesized in Example 3.

Example 15

An organic EL element of Example 15 was obtained in the same manner as in Example 12, except that a compound of formula (12) synthesized in Example 4 was used as a material for the capping layer 9.

Example 16

An organic EL element of Example 16 was obtained in the same manner as in Example 12, except that a compound of formula (76) synthesized in Example 5 was used as a material for the capping layer 9.

Example 17

The organic EL element of Example 17 was obtained in the same manner as in Example 12, except that the capping layer 9 was made of a compound of formula (77) synthesized in Example 6.

Example 18

The organic EL element of Example 18 was obtained in the same manner as in Example 12, except that the capping layer 9 was made of a compound of formula (78) synthesized in Example 7.

Example 19

The organic EL element of Example 19 was obtained in the same manner as in Example 12, except that the capping layer 9 was made of a compound of formula (79) synthesized in Example 8.

Example 20

The organic EL element of Example 20 was obtained in the same manner as in Example 12, except that the capping layer 9 was made of a compound of formula (80) synthesized in Example 9.

Example 21

The organic EL element of Example 21 was obtained in the same manner as in Example 12, except that the capping layer 9 was made of a compound of formula (60) synthesized in Example 10.

Example 22

The organic EL element of Example 22 was obtained in the same manner as in Example 12, except that the capping layer 9 was made of a compound of formula (85) synthesized in Example 11.

Comparative Example 1

The organic EL element of Comparative Example 1 was obtained in the same manner as in Example 12 except that the capping layer 9 was made of a compound represented by the above formula (2-1).

Comparative Example 2

The organic EL element of Comparative Example 2 was obtained in the same manner as in Example 12 except that $Alq_3$ was used as the material of the capping layer 9.

The characteristics of the organic EL elements of Examples 12 to 22, Comparative Example 1, and Comparative Example 2 were measured in the atmosphere at room temperature.

Specifically, the driving voltage, luminance, luminous efficiency, and power efficiency were measured at a current density of 10 mA/cm² when a DC voltage was applied to each organic EL element. The results are shown in Table 3.

The organic EL elements of Examples 12 to 22, Comparative Example 1, and Comparative Example 2 were driven at a constant current of 10 mA/cm² at room temperature in the atmosphere, and the time until the luminance decayed to 95% when the initial luminance was set to 100% was measured and evaluated as the lifetime (element lifetime). The results are shown in Table 3.

TABLE 3

| | Capping layer | Voltage [V] (10 mA/cm²) | Luminance [cd/m²] (10 mA/cm²) | Luminous efficiency [cd/A] (10 mA/cm²) | Power efficiency [lm/W] (10 mA/cm²) | Element lifetime 95% decay |
|---|---|---|---|---|---|---|
| Example 12 | Compound 10 | 3.65 | 702 | 7.02 | 6.04 | 157 hrs |
| Example 13 | Compound 16 | 3.64 | 687 | 6.87 | 5.93 | 156 hrs |
| Example 14 | Compound 17 | 3.64 | 680 | 6.80 | 5.87 | 155 hrs |
| Example 15 | Compound 12 | 3.65 | 699 | 6.99 | 6.02 | 163 hrs |
| Example 16 | Compound 76 | 3.67 | 719 | 7.19 | 6.16 | 171 hrs |
| Example 17 | Compound 77 | 3.67 | 721 | 7.21 | 6.17 | 180 hrs |
| Example 18 | Compound 78 | 3.67 | 678 | 6.78 | 5.80 | 149 hrs |
| Example 19 | Compound 79 | 3.67 | 680 | 6.80 | 5.82 | 151 hrs |
| Example 20 | Compound 80 | 3.66 | 687 | 6.87 | 5.90 | 160 hrs |
| Example 21 | Compound 60 | 3.64 | 725 | 7.25 | 6.26 | 182 hrs |
| Example 22 | Compound 85 | 3.67 | 682 | 6.82 | 5.84 | 157 hrs |
| Comparative Example 1 | Comparative compounds (2-1) | 3.69 | 668 | 6.68 | 5.68 | 121 hrs |
| Comparative Example 2 | $Alq_3$ | 3.67 | 647 | 6.47 | 5.54 | 106 hrs |

As shown in Table 3, the driving voltage at a current density of 10 mA/cm² was almost the same in the organic EL elements of Examples 12 to 22, Comparative Example 1, and Comparative Example 2.

As shown in Table 3, the organic EL elements of Examples 12 to 22 had higher luminance, luminous efficiency, and power efficiency than the organic EL elements of Comparative Examples 1 and 2. This indicates that, by using compound represented by formula (10), (12), (16), (17), (60), (76), (77), (78), (79), (80), and (85) as a material of the capping layer of the organic EL element, the light extraction efficiency can be greatly improved as compared with the case of using the compound represented by formula (2-1) and $Alq_3$.

The organic EL elements of Examples 12 to 22 had a longer life than those of Comparative Examples 1 and 2.

In particular, the organic EL elements of Examples 15 to 17 and Example 22 using a compound represented by the formula (12) (60) (76) (77) as the material of the capping layer had a long life.

INDUSTRIAL APPLICABILITY

As described above, an amine compound having a benzazole ring structure represented by formula (A-1) or (A-2) and suitably used in an organic EL element of the present disclosure has a high absorption coefficient, a high refractive index, and a stable thin film state. Therefore, it is excellent as a compound used for a capping layer of the organic EL element. By producing the capping layer of the organic EL element using the compound, the light extraction efficiency can be greatly improved, high light emission efficiency and power efficiency can be obtained, and durability and light resistance can be improved because the light of sunlight is absorbed and the material inside the element is not affected.

Further, the compound represented by formula (A-1) or (A-2) does not have absorption in each wavelength region of blue, green and red. Therefore, an organic EL element having a capping layer using the compound is particularly suitable for displaying a clear and bright image with good color purity. For example, it has become possible to develop applications for home appliances and lighting.

REFERENCE NUMBER IN DRAWINGS

1 Glass substrate
2 Anode
3 Hole injection layer
4 Hole transport layer
5. Luminous layer
6 Electron transport layer
7 Electron injection layer
8 Cathode
9 Capping layer

The invention claimed is:

1. An organic electroluminescent element comprising at least an anode, a hole transport layer, a luminous layer, an electron transport layer, a cathode and a capping layer in this order, wherein the capping layer comprises an amine compound having a benzazole ring structure represented by a general formula (A-1),

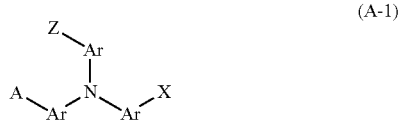
(A-1)

wherein in formula (A-1), A and X may be the same or different from each other, and each represents a monovalent group represented by the following general formulae (B-4), or (B-6); Z represents a substituted or unsubstituted aromatic heterocyclic group; and Ar may be the same or different from each other, and each represents a single bond or a divalent group of a substituted or unsubstituted aromatic hydrocarbon group, a substituted or unsubstituted aromatic heterocyclic group, or a substituted or unsubstituted fused polycyclic aromatic group,

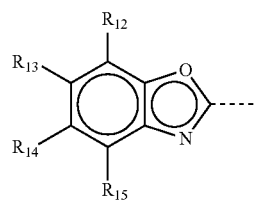
(B-4)

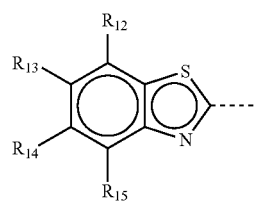
(B-6)

wherein in formulae (B-4), or (B-6), a broken line part is used as a binding site; $R_{12}$ to $R_{15}$ may be the same or different from each other, and each represents a hydrogen atom, a deuterium atom, a fluorine atom, a chlorine atom, a cyano group, nitro group, a straight or branched alkyl group having 1 to 6 carbon atoms which may have a substituent, a cycloalkyl group having 5 to 10 carbon atoms which may have a substituent, a straight or branched alkenyl group having 2 to 6 carbon atoms which may have a substituent, a straight or branched alkyloxy group having 1 to 6 carbon atoms which may have a substituent, a cycloalkyloxy group having 5 to 10 carbon atoms which may have a substituent, a substituted or unsubstituted aromatic hydrocarbon group, a substituted or unsubstituted aromatic ring group, a substituted or unsubstituted fused polycyclic aromatic group or a substituted or unsubstituted aryloxy group.

2. The organic electroluminescent element according to claim 1,
wherein A and X in the formula (A-1) represent a monovalent group represented by the formula (B-4).

3. The organic electroluminescent element according to claim 1,
wherein A and X in the formula (A-1) represent a monovalent group represented by the formula (B-6).

4. The organic electroluminescent element according to claim 1,
wherein A and X in the formula (A-1) are the same.

5. The organic electroluminescent element according to claim 1,
wherein A and X in the formula (A-1) are different.

6. The organic electroluminescent element according to claim 1,
wherein the capping layer has a thickness in the range of 30 nm to 120 nm.

7. The organic electroluminescent element according to claim 1,
wherein a refractive index of the capping layer is 1.85 or more in the wavelength range of 450 nm to 750 nm of light transmitted through the capping layer.

8. A method of producing the organic electroluminescent element according to claim 2,
wherein the capping layer of the organic electroluminescent element is formed by using an amine compound having a benzoxazole ring structure in which A and X in the general formula (A-1) are represented by the general formula (B-4).

9. A method of producing the organic electroluminescent element according to claim 3,
wherein the capping layer of the organic electroluminescent element is formed by using an amine compound having a benzothiazole ring structure in which A and X in the general formula (A-1) are represented by the general formula (B-6).

10. The organic electroluminescent element according to claim 1,
wherein Z in the general formula (A-1) represents a substituted or unsubstituted dibenzofuranyl group, or a substituted or unsubstituted dibenzothienyl group.

11. The organic electroluminescent element according to claim 1,
wherein the amine compound is at least one compound selected from the group consisting of compounds represented by the following formulae (21), (24) and (25),

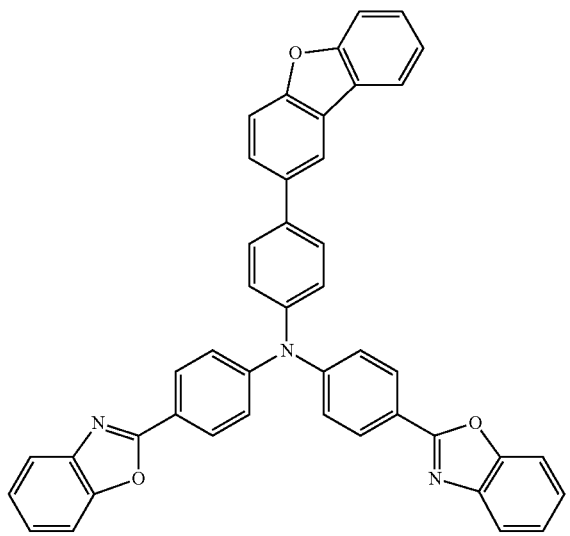
(21)

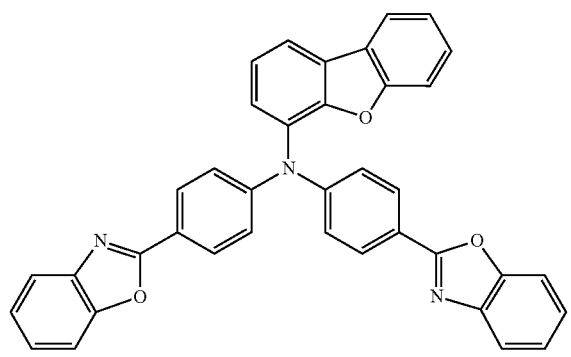
(24)
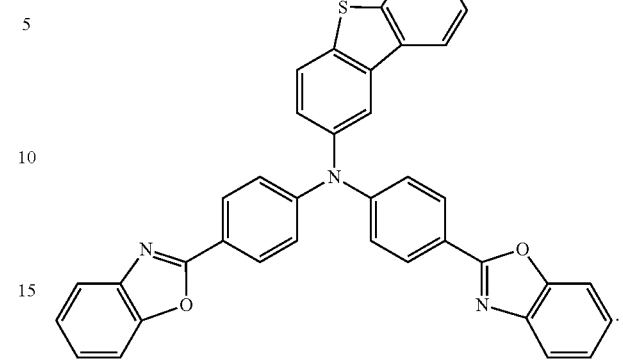
(25)
* * * * *